US009966871B2

(12) United States Patent
Ishimaru et al.

(10) Patent No.: US 9,966,871 B2
(45) Date of Patent: May 8, 2018

(54) RECTIFICATION DEVICE, ALTERNATOR, AND POWER CONVERSION DEVICE

(71) Applicant: Hitachi Power Semiconductor Device, Ltd., Hitachi-shi, Ibaraki (JP)

(72) Inventors: Tetsuya Ishimaru, Tokyo (JP); Kohhei Onda, Tokyo (JP); Junichi Sakano, Tokyo (JP); Mutsuhiro Mori, Tokyo (JP)

(73) Assignee: Hitachi Power Semiconductor Device, Ltd., Hitachi-shi (JP)

( * ) Notice: Subject to any disclaimer, the term of this patent is extended or adjusted under 35 U.S.C. 154(b) by 0 days. days.

(21) Appl. No.: 15/104,116

(22) PCT Filed: Dec. 12, 2014

(86) PCT No.: PCT/JP2014/083028
§ 371 (c)(1),
(2) Date: Jun. 13, 2016

(87) PCT Pub. No.: WO2015/088020
PCT Pub. Date: Jun. 18, 2015

(65) Prior Publication Data
US 2016/0315553 A1 Oct. 27, 2016

(30) Foreign Application Priority Data

Dec. 13, 2013 (JP) .................................. 2013-257733

(51) Int. Cl.
*H02M 7/219* (2006.01)
*H02M 7/04* (2006.01)
(Continued)

(52) U.S. Cl.
CPC ............... *H02M 7/04* (2013.01); *H02M 1/08* (2013.01); *H02M 7/219* (2013.01);
(Continued)

(58) Field of Classification Search
CPC . H02M 2001/0029; H02M 2007/2195; H02M 7/219; H03K 17/162
See application file for complete search history.

(56) References Cited

U.S. PATENT DOCUMENTS 5,216,299 A * 6/1993 Wanlass ................ H03K 3/012
326/103
5,583,457 A 12/1996 Horiguchi et al.
(Continued)

FOREIGN PATENT DOCUMENTS

JP 9-105763 A 4/1997
JP 2003-243971 A 8/2003
(Continued)

OTHER PUBLICATIONS

International Search Report (PCT/ISA/210) issued in PCT Application No. PCT/JP2014/083028 dated Mar. 10, 2015 with English translation (5 pages).
(Continued)

*Primary Examiner* — Harry Behm
(74) *Attorney, Agent, or Firm* — Crowell & Moring LLP

(57) ABSTRACT

A rectifier including an autonomous type synchronous-rectification MOSFET is provided, which prevents chattering and through-current caused by a malfunction when a noise is applied. The rectifier includes: a rectification MOSFET for performing synchronous rectification; a determination circuit configured to input a voltage between a pair of main terminals of the rectification MOSFET, and to determine whether the rectification MOSFET is in on or off state on the basis of the inputted voltage; and a gate drive circuit configured such that a gate of the rectification MOSFET is turned on and off by a comparison signal from the determination circuit, and such that a time required to boost a gate voltage when the rectification MOSFET is turned on is
(Continued)

longer than a time required to lower the gate voltage when the rectification MOSFET is turned off.

14 Claims, 21 Drawing Sheets

(51) Int. Cl.
    *H02M 1/08*     (2006.01)
    *H03K 17/16*     (2006.01)
    *H02M 1/00*     (2006.01)

(52) U.S. Cl.
    CPC ... *H03K 17/163* (2013.01); *H02M 2001/0029* (2013.01); *H02M 2007/2195* (2013.01); *Y02B 70/1408* (2013.01)

(56) References Cited

U.S. PATENT DOCUMENTS

| | | | |
|---|---|---|---|
| 5,877,647 | A | 3/1999 | Vajapey et al. |
| 9,419,608 | B2 * | 8/2016 | Hwang ............... H03K 17/133 |
| 2001/0024378 | A1 * | 9/2001 | Assow ............. H02M 3/33592 |
| | | | 363/127 |
| 2009/0261798 | A1 | 10/2009 | Sachdev et al. |
| 2009/0302678 | A1 | 12/2009 | Kokubun et al. |
| 2010/0060245 | A1 * | 3/2010 | Namuduri ................ H02P 9/02 |
| | | | 322/89 |
| 2010/0176783 | A1 | 7/2010 | Tagome |
| 2010/0244559 | A1 | 9/2010 | Goerlach et al. |
| 2012/0286752 | A1 * | 11/2012 | Tsukiji ................. H02M 3/156 |
| | | | 323/282 |
| 2013/0193937 | A1 | 8/2013 | Horie |
| 2014/0168829 | A1 * | 6/2014 | Johnson, Jr. ......... H03K 17/165 |
| | | | 361/42 |

FOREIGN PATENT DOCUMENTS

| | | |
|---|---|---|
| JP | 2006-320179 A | 11/2006 |
| JP | 2007-110869 A | 4/2007 |
| JP | 2009-296807 A | 12/2009 |
| JP | 2011-507468 A | 3/2011 |
| JP | 2012-147591 A | 8/2012 |
| JP | 2013-5474 A | 1/2013 |
| JP | 2013-158175 A | 8/2013 |

OTHER PUBLICATIONS

Japanese-language Written Opinion (PCT/ISA/237) issued in PCT Application No. PCT/JP2014/083028 dated Mar. 10, 2015 (7 pages).
Extended European Search Report issued in counterpart European Application No. 14870115.4 dated Jul. 14, 2017 (Nine (9) pages).

* cited by examiner t31 t32                t33 t34

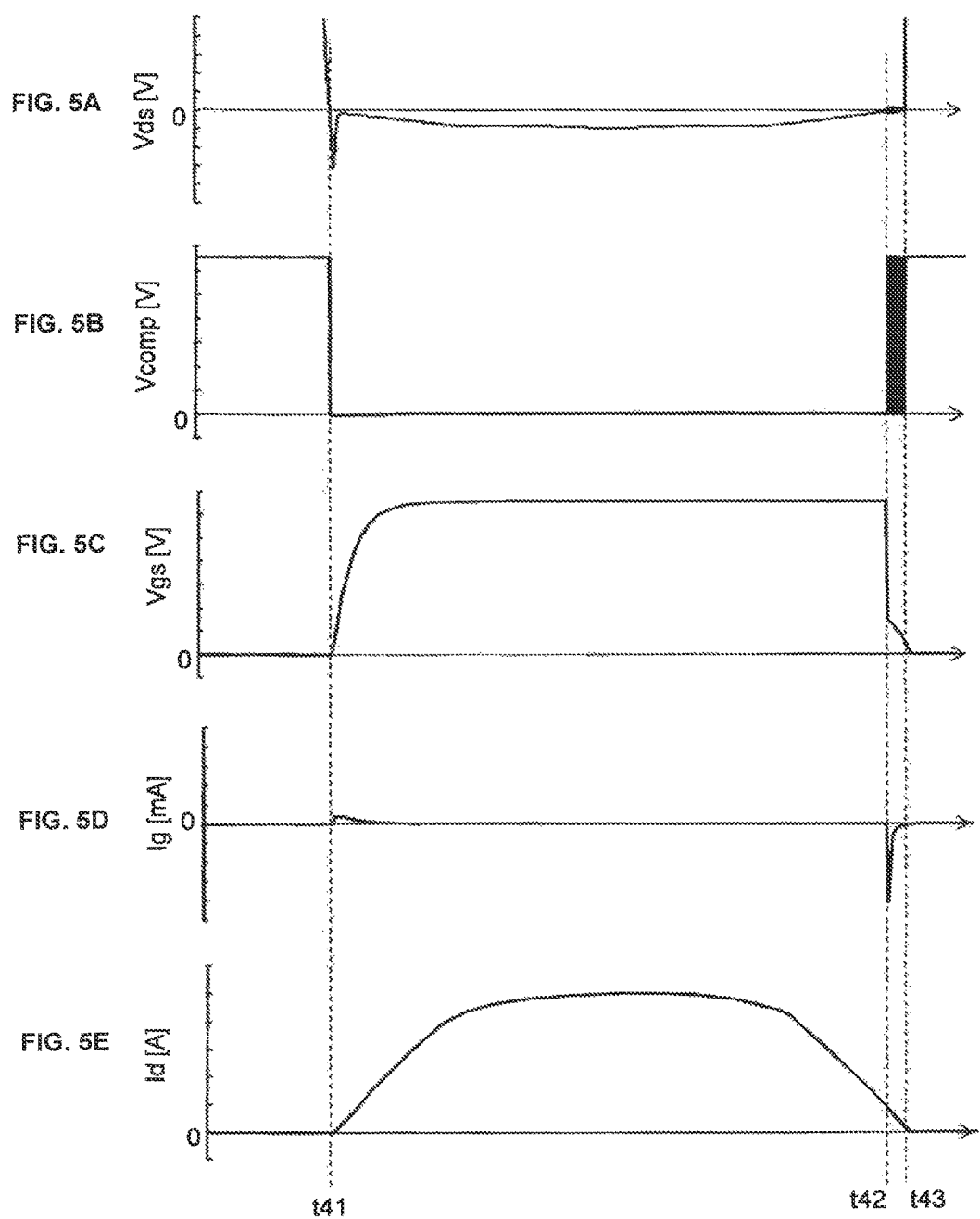

FIG. 6A  Vu
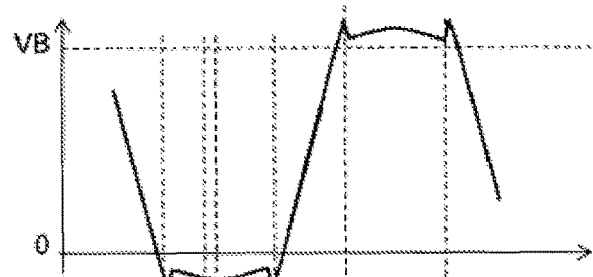
FIG. 6B  VcompH
FIG. 6C  VgsH
FIG. 6D  IdH
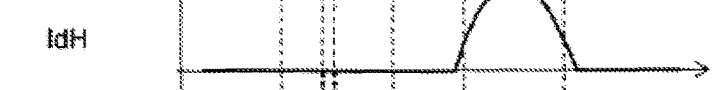
FIG. 6E  VcompL
FIG. 6F  VgsL
FIG. 6G  IdL
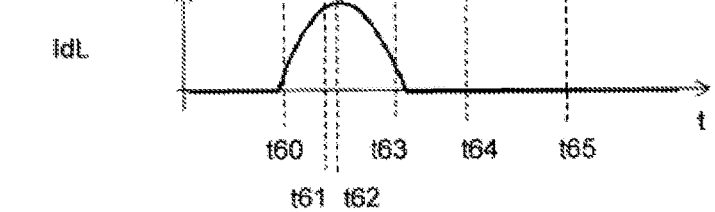

RECTIFICATION DEVICE, ALTERNATOR, AND POWER CONVERSION DEVICE

TECHNICAL FIELD

The present invention relates to a rectifier of autonomous type synchronous rectification MOSFET (Metal Oxide Semiconductor Field Effect Transistor), and an alternator and a power converter using this rectifier.

BACKGROUND ART

An alternator that generates electricity in an automobile has heretofore used a diode as a rectifier. The diode is inexpensive but has a forward voltage drop causing a large power loss. Contrastingly, in recent years, MOSFET has begun to be used as the rectifier for the alternator. Synchronous rectification of the MOSFET enables developing of a rectifier that has no forward voltage drop and raises a forward current at 0 Volt and generates a small power loss.

A power supply outputs an AC power with a constant frequency, and therefore, when a MOSFET is used for a rectifier of the power supply, on-off control of the MOSFET can be performed by way of synchronization with a clock. However, the alternator outputs an AC power with a non-constant frequency with a coil, and therefore, when a MOSFET is used for a rectifier of the alternator, on-off control of the MOSFET does not require the simple synchronization with the clock like the MOSFET used for the power supply or the like, but requires synchronizations with various frequencies.

Accordingly, a method is thought out of controlling the MOSFET by way of a detection of a position of the motor by using a Hall element. However, the method using the Hall element is not able to replace a currently used rectifier without any other changes, but needs a drastic change of the alternator.

The claim 1 of Patent Literature 1 describes "A rectification circuit, comprising: a cathode terminal (K1); an anode terminal (A1); and an electronic circuit provided between the cathode terminal and the anode terminal, the electronic circuit including an MOS transistor (T1) having an inverse diode (D6) integrated, a capacitor (C1) and a differential amplifier (T2, T3, R1, R2, R3)." The paragraph 0018 of Patent Literature 1, "If the electrical potential at cathode terminal K1 of the rectification circuit is more positive than the electrical potential at anode terminal A1 of the rectification circuit and if this potential difference exceeds a value set by Zener diode D4, the input potential of the power amplifying stage consisting of transistors T4 and T5 is raised. This also increases the gate-to-source voltage at MOS transistor T1 and a current flow comes about between the drain and the source of MOS transistor T1." Here, the MOSFET of the structure described in Patent Literature 1 is referred to as an autonomous type of MOSFET.

An autonomous type synchronous rectification MOSFET needs no sensor such as a Hall element and generally needs a simple control circuit, and thus allows a rectification part of the alternator to be configured at inexpensive cost.

Paragraph 0013 of Patent Literature 2 describes "At the first half stage of the transition period to the turn-on, the rising rate of the gate voltage at the voltage-driven element is relatively increased; contrastingly at the second half stage of the transition period to the turn-on, the rising rate of the gate voltage at the voltage-driven element is relatively decreased. This improves a trade-off in switching characteristics when the voltage-driven element is turned on." Paragraph 0029 describes that the effect of the trade-off is ""suppressing the surge and the ringing phenomenon of the drain current when the transistor Tr1 is turned on"."

The ringing phenomenon that is the problem to be solved by Patent Literature 2 means an oscillation generated when switching a switching element between on and off. The ringing is a phenomenon caused by inductors and parasitic capacitances in a substrate upon a high speed switching.

CITATION LIST

Patent Literature

Patent Literature 1: Japan Unexamined Patent Publication No. 2011-507468

Patent Literature 2: Japan Unexamined Patent Publication No. 2012-147591

SUMMARY OF INVENTION

Technical Problem

The above-described autonomous type synchronous rectification MOSFET has an advantage of providing a low cost rectifier, but a disadvantage of being prone to generate a chattering causing a repetition of erroneous determinations of the MOSFET on/off state and prone to cause a malfunction of on/off switching of the MOSFET due to a noise.

The reason of the chattering causing the repetition of the erroneous determinations of the MOSFET on/off state is that the autonomous type synchronous rectification MOSFET performs the determination of the MOSFET on/off state on the basis of a voltage between a source and a drain of the MOSFET, and a rectified current flows also in an built-in diode of the MOSFET, and thus, a switch between a status of a current flowing through the MOSFET and a status of a current flowing through the built-in diode causes a great variation of the voltage between the source and the drain of the MOSFET. Further, the reason of the malfunction of the on/off switching of the MOSFET is that the determination of the MOSFET on/off state on the basis of the voltage between the source and the drain of the MOSFET allows a fluctuation of the voltage between the source and drain of the MOSFET caused by a noise generated on an electric line connected to the source or the drain of the MOSFET to cause the malfunction of the on/off switching of the MOSFET.

When using the autonomous type synchronous rectification MOSFET for the alternator, one of difficulties is to properly perform an autonomous type of control in wide conditions such as a wide temperature range, a wide frequency of a generated AC power, a broad range of an output current, and a fluctuating battery voltage. Further, the frequency range of the generated AC power for the alternator is not only wide, but also low from tens Hz to several kHz. Such a low frequency of the generated AC power would makes a change over time of the voltage between the source and the drain slow and makes an on/off switching take a long time, and thus the above-described chattering is likely to occur.

Incidentally, Patent Literature 2, as described in its first embodiment (see paragraph 0029 and FIG. 3), discloses a configuration in which "the rising speed of the gate voltage is relatively increased in the former half stage of the turn-on transition period, and is relatively decreased in the latter half stage of the turn-on transition period." Therefore, for example, if the turn-off speed of the gate voltage is set to be faster in both of the former and latter half periods of the turn-off transition, there could be thought of a case in which the sum of the turn-on speeds in the former and latter halves of the turn-on period is slower than the sum of the turn-off speeds in the former and latter halves of the turn-off periods. This may cause, at first glance, Patent Literature 2 to appear as if it discloses a configuration in which a turn-on speed of the MOSFET gate is lower than a turn-off speed thereof.

However, the problem of Patent Literature 2 is, as described in paragraph 0012, "to improve the trade-off in the switching characteristics even if the turn-on or turn-off transition of a voltage-driven element is increased in speed." That is, the invention described in Patent Literature 2 premises that the switching speed is fast. The above-described trade-off is, as described in paragraph 0006 of Patent Literature 2, refers to a relationship between the switching loss and the surge and a relationship between the switching loss and the ringing. The surge and ringing which may be suppressed by slowing the turn-on speed may be a problem particularly when the switching speed is fast. In addition, Patent Literature 2 never discloses any invention having as a component the "autonomous" type of element that determines the on/off state of the MOSFET on the basis of the voltage between the source and drain of the MOSFET.

Contrastingly, the suppression of the chattering to be resolved by the present invention may be, for example, as when used for the alternator, a problem particularly when the switching speed is slow. In addition, the suppression of the chattering and the through-current generated when a noise is applied, which are the problems to be solved by the present invention, is a problem caused by performing the autonomous type of control. Accordingly, the invention described in Patent Literature 2 is not intended to solve the problem for the present invention, such as the suppression of the chattering and the through-current generated when a noise is applied, and thus, it should be noted that the invention disclosed in Patent Literature 2 is essentially different from the invention of the present invention.

The object of the present invention is to provide a rectifier of an autonomous type synchronous rectification MOSFET capable of preventing the chattering and preventing the through-current from flowing, which is caused by a malfunction when a noise is applied, and the alternator and the power converter using this rectifier.

Solution to Problem

To solve the problems described above, the rectifier of the first invention includes: a rectification MOSFET configured to perform synchronous rectification; a determination circuit is configured to: input a voltage between a pair of main terminals of the rectification MOSFET; and determine on and off state of the rectification MOSFET on a basis of the voltage between the pair of main terminals, a gate drive circuit configured to perform turn on and off of a gate of the rectification MOSFET according to a determination result from the determination circuit; and make a time required for boosting a gate voltage when turning on the rectification MOSFET longer than a time required for lowering the gate voltage when turning off the rectification MOSFET.

The alternator of the second aspect of the invention includes: a rectification circuit of bridge-type, in which a DC terminal is connected to a battery and an AC terminal is connected to an AC power source; and the rectifiers that are connected respectively to the high-side and the low-side of the rectification circuit.

A power converter of the third invention includes: a rectification circuit of bridge-type, in which a DC terminal is connected to an energy storing unit and an AC terminal is connected to an AC power source; the rectifiers that are connected respectively to the high-side and the low-side of the rectification circuit. Other means is described in the explanation of the embodiments of the invention.

Advantageous Effects of Invention

The present invention provides a rectifier of the autonomous type synchronous rectification MOSFET to prevent chattering and to prevent a through-current caused by a malfunction during a noise is applied, an alternator and power converter using the rectifier.

BRIEF DESCRIPTION OF DRAWINGS

FIGS. 5A to 5E are graphs showing waveforms at respective parts of the rectifier of the first embodiment (Part 2).

FIGS. 6A to 6G are graphs showing a through-current flowing through the rectifier of the first embodiment.

DESCRIPTION OF EMBODIMENTS

The inventors of the present invention has been found that the rectifier of the autonomous type of the synchronous rectification MOSFET is incorporated a configuration in which the turn-on speed of the MOSFET gate is lower than the turn-off speed thereof, and thereby, the effect of suppressing the chattering and the noise-caused malfunction can be obtained.

Hereinafter, a detailed description is made on the embodiment of the present invention with reference to the drawings. In each drawing for explaining the embodiments, elements having the same function are assigned the same reference signs and the repetitive description thereof is omitted appropriately. And, in the description of the embodiments below, a description of the same or similar parts is omitted without a repetition unless particularly needed.

Figure 1:
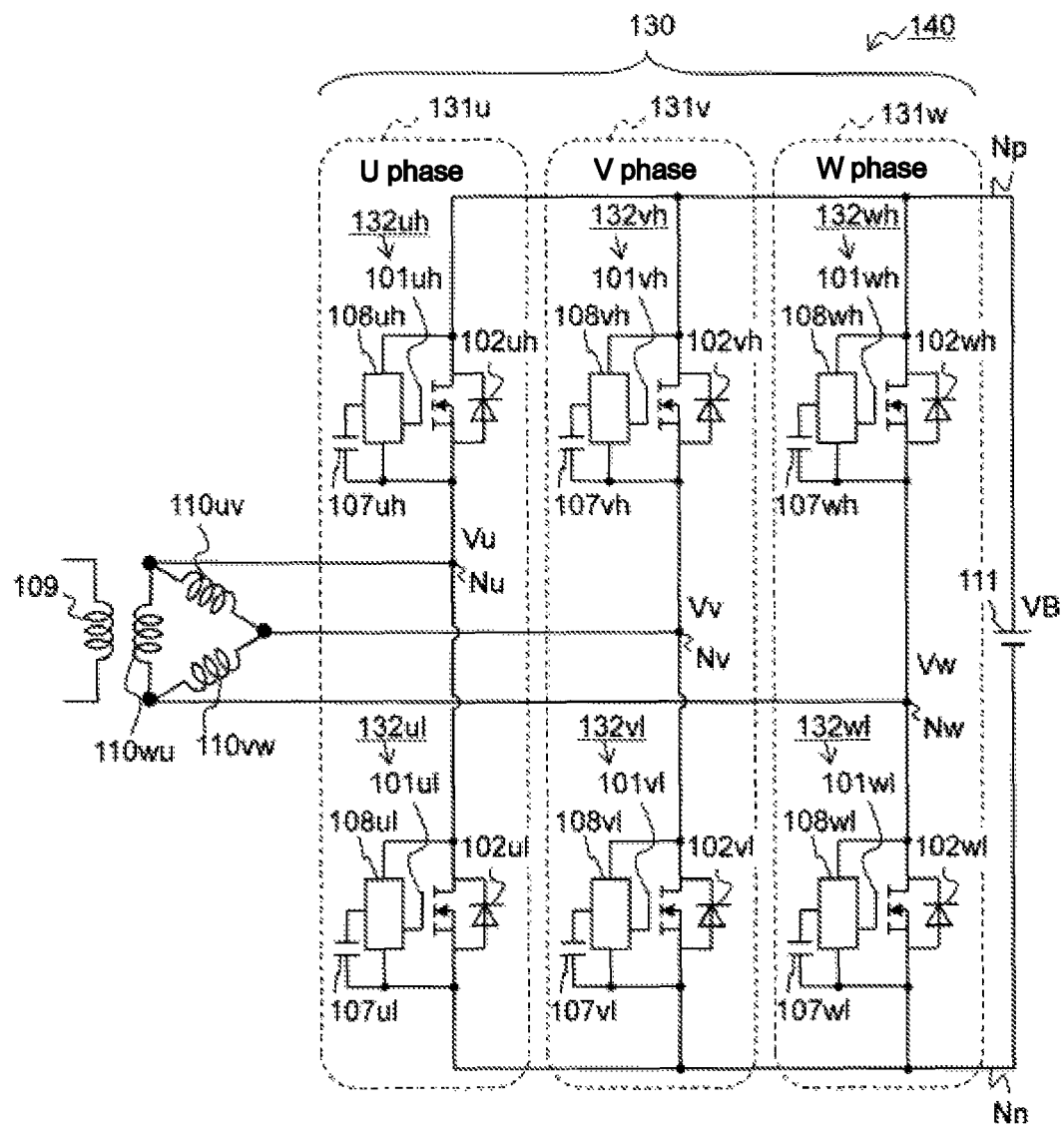
FIG. 1 is a circuit diagram showing a schematic configuration of an alternator using the autonomous type of rectifier.

FIG. 1 is a circuit diagram showing a schematic configuration of an alternator using the autonomous type of rectifier. This configuration of the alternator is common in a comparative example and each embodiment.

As shown in FIG. 1, an alternator 140 using a rectifier 132 of an autonomous type synchronous rectification MOSFET is configured to include a power generation unit including a rotor coil 109 and stator coils 110uv, 110vw, and 110wu; and a rectification circuit 130.

The power generation unit is configured to include the rotor coil 109 and three stator coils 110uv, 110vw, and 110wu that are Δ-connected. A midpoint line for a U-phase part 131u is drawn from a node at which a stator coil 110wu is connected with a stator coil 110uv. A midpoint line for a V-phase part 131v is drawn from a node at which a stator coil 110uv is connected with a stator coil 110vw. A midpoint line for a W-phase part 131w is drawn from a node at which a stator coil 110vw is connected with a stator coil 110wu. Note that the connection between respective stator coils 110uv, 110vw, and 110wu may be a Y-connection instead of Δ-connection, and not be limited thereto.

The rectification circuit 130 is configured to include a U-phase part 131u, a V-phase part 131v, and W-phase part 131w, and to rectify a three-phase alternating current among nodes Nu, Nv, and Nw to a direct current to make the direct current flow between nodes Np and Nn (between DC terminals). The midpoint node Nu of the U-phase part 131u is connected to a rectifier 132uh at high-side, and to a rectifier 132ul at low-side. The midpoint node Nv of the V-phase part 131v is connected to a rectifier 132vh at high-side, and to a rectifier 132vl at low-side. The midpoint node Nw of the W-phase part 131w is connected to a rectifier 132wh at high-side, and to a rectifier 132wl at low-side. The rectifiers 132uh, 132vh, and 132wh at the high-side is connected to a node Np of the positive side of the direct current and further to a positive terminal of a battery 111 (energy storage part). The rectifiers 132ul, 132vl, and 132wl at the low-side are connected to a node Nn of the negative side of the direct current and further to a negative terminal of the battery 111.

The battery 111 (energy storage part) is, for example, a vehicle battery, and operates roughly in a range of, for example, from 10.8 V to 14 V.

The rectifier 132uh at the high-side of the U-phase part 131u is configured to include a rectification MOSFET 101uh, a built-in diode 102uh, a control IC (Integrated Circuit) 108uh, and a capacitor 107uh. The rectifier 132ul at the low-side of the U-phase part 131u is similarly configured to include a rectification MOSFET 101ul, a built-in diode 102ul, a control IC (Integrated Circuit) 108ul, and a capacitor 107ul.

The rectifier 132vh at the high-side of the V-phase part 131v is configured to include a rectification MOSFET 101vh, a built-in diode 102vh, a control IC (Integrated Circuit) 108vh, and a capacitor 107vh. The rectifier 132vl at the low-side of the V-phase part 131v is similarly configured to include a rectification MOSFET 101vl, a built-in diode 102vl, a control IC (Integrated Circuit) 108vl, and a capacitor 107vl.

The rectifier 132wh at the high-side of the W-phase part 131w is configured to include a rectification MOSFET 101wh, a built-in diode 102wh, a control IC (Integrated Circuit) 108wh, and a capacitor 107wh. The rectifier 132wl at the low-side of the W-phase part 131w is similarly configured to include a rectification MOSFET 101wl, a built-in diode 102wl, a control IC (Integrated Circuit) 108wl, and a capacitor 107wl.

Alternatively, the rectifiers 132ul, 132vl, and 132wl at the low-sides of respective phases can be supplied with power for the control ICs 108ul, 108vl, and 108wl easily from the outside of the devices, and thus may be supplied with the power from the outside without using the capacitors 107ul, 107vl, and 107wl.

Hereinafter, when each rectifier 132uh to 132wl is not particularly distinguished from each other, each device is described as a rectifier 132y and 132z in the comparative examples, and as a rectifier 132, and 132a to 132c in each embodiment.

When each control IC 108uh to 108wl is not particularly distinguished from each other, each control IC is described as a control IC 108y and 108z in the comparative example, and as a control IC 108 or 108a to 108c in each embodiment. When the rectification MOSFETs 101uh to 101wl are not particularly distinguished from each other, they are simply referred to as a rectification MOSFET 101. When each built-in diode 102uh to 102wl is not particularly distinguished from each other, it is simply referred to as a built-in diode 102. When each capacitor 107uh to 107wl is not particularly distinguished from each other, it is simply referred to as a capacitor 107.

Figure 17:
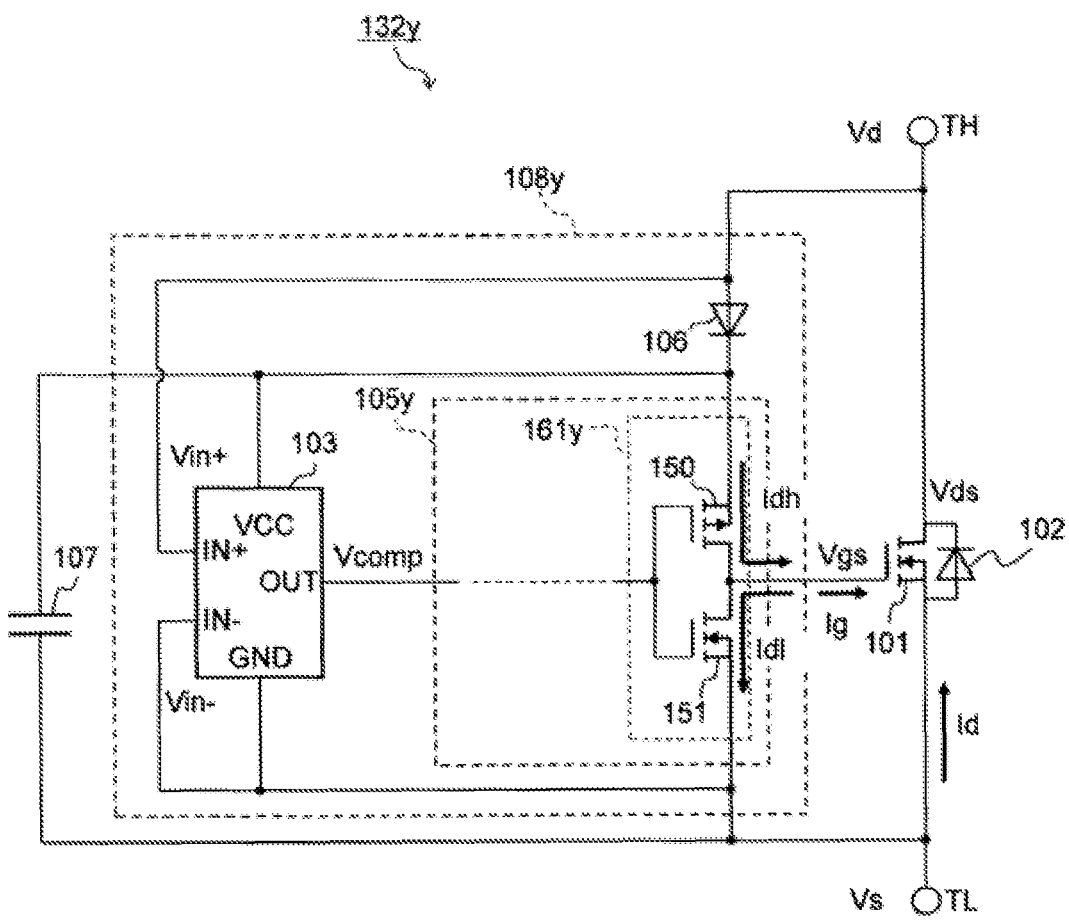
FIG. 17 is a circuit diagram showing a rectifier of the autonomous type synchronous rectification MOSFET in a first comparative example.

FIG. 17 is a circuit diagram showing a rectifier 132y of an autonomous type synchronous rectification MOSFET in a first comparative example.

As shown in FIG. 17, the rectifier 132y is configured to include a rectification MOSFET 101, a built-in diode 102 incorporated in a chip of the rectification MOSFET 101, a determination circuit 103, a gate drive circuit 105y, a diode 106, and a capacitor 107. The rectifier 132y causes a current to flow from the negative main terminal TL to the positive main terminal TH.

A power MOSFET is used for the rectification MOSFET 101 in order to let a large current generated by a power generation part of the alternator 140 flow. The rectification MOSFET 101 performs the synchronous rectification. The rectification MOSFET 101 has a drain connected to the positive main terminal TH and a source connected to the negative main terminal TL. This makes the built-in diode 102 of the rectification MOSFET 101 have its anode connected to the negative main terminal TL, and have its cathode connected to the positive main terminal TH.

The determination circuit 103 has a non-inverted input terminal IN+ connected to the drain of the rectification MOSFET 101, and an inverted input terminal IN− connected to the source of the rectification MOSFET 101. An output terminal OUT of the determination circuit 103 is connected to an input terminal of the gate drive circuit 105y. The output terminal OUT of the determination circuit 103 outputs a comparison signal Vcomp. The determination circuit 103 may be a comparator having a standard function, and generates the comparison signal Vcomp with reference to a voltage Vin+ at the non-inverted input terminal IN+ and voltage Vin− at the inverted input terminal IN−. Thereby, the determination circuit 103 outputs a comparison result of the source voltage Vs at the negative main terminal TL with the drain voltage Vd at the positive main terminal TH. The determination circuit 103 is preferably of high precision performance.

The diode 106 is connected with the positive main terminal TH and a positive terminal of the capacitor 107 in a direction from the positive main terminal TH toward the positive terminal of the capacitor 107. The positive terminal of the capacitor 107 is connected to a power supply voltage terminal VCC of the determination circuit 103 and the gate drive circuit 105y to supply DC power.

The output terminal of the gate drive circuit 105y is connected to the gate of the rectification MOSFET 101. The gate drive circuit 105y outputs a gate voltage Vgs. The gate drive circuit 105y is configured to include a CMOS (Complementary MOS) buffer 161y. The CMOS buffer 161y is configured to include a circuit connecting a high-side P-type MOSFET 150 with a low-side N-type MOSFET 151 in series.

The control IC 108y is configured to include the determination circuit 103, the gate drive circuit 105y, and the diode 106.

The capacitor 107 supplies power for driving the control IC 108y. Using the capacitor 107 for the power supply makes the number of terminals of the rectifier 132y become two and allows compatibility of the terminals with terminals of a conventional rectification diode used in the alternator 140, which enables replacement of a conventional rectification diode with the rectifier 132y and improvement of the performance of the alternator 140.

The high-side of each phase part of the alternator 140 shown in FIG. 1 has the positive main terminal TH of the rectifier 132y connected to the positive terminal of the battery 111 through the node Np; and the negative main terminal TL of the rectifier 132y connected to each of the midpoint nodes Nu, Nv, and Nw.

The low-side of each phase part has the positive main terminal TH of the rectifier 132y connected to each of the midpoint nodes Nu, Nv, and Nw; and the negative main terminal TL of the rectifier 132y connected to the negative terminal of the battery 111 through the node Nn.

FIGS. 18A to 18E are graphs No. 1 showing waveforms of respective parts of the rectifier of the first comparative example. Each horizontal axis in FIGS. 18A to 18E shows a time that is common between them.

FIGS. 18A to 18E show waveforms of the voltages and currents in the rectifier 132ul used in the low-side of the U-phase part 131u, in a period during which the rectification MOSFET 101ul in the low-side is ON and additional periods just before and after the rectification MOSFET 101ul in the low-side is ON. Below, the rectifier 132ul is sometimes described simply as the rectifier 132y, and the rectification MOSFET 101ul is sometimes referred to simply as the rectification MOSFET 101.

Figure 18A:
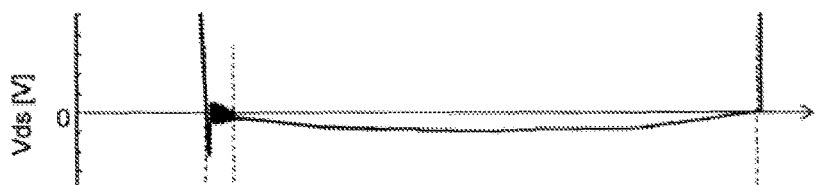
FIGS. 18A to 18E are graphs showing waveforms of respective parts of the rectifier of the first comparative example (Part 1).
Figure 18B:

FIG. 18A is a graph showing the drain-source voltage Vds of the rectification MOSFET 101. The drain-source voltage Vds is the same as a voltage applied between the non-inverted input terminal IN+ and the inverted input terminal IN− of the determination circuit 103. The non-inverted input terminal IN+ of the determination circuit 103 is connected to the positive main terminal TH and applied with the drain voltage Vd. The inverted input terminal IN− of the determination circuit 103 is connected to the negative main terminal TL and applied with the source voltage Vs. FIG. 18B is a graph showing the comparison signal Vcomp outputted by the determination circuit 103.

Figure 18C:
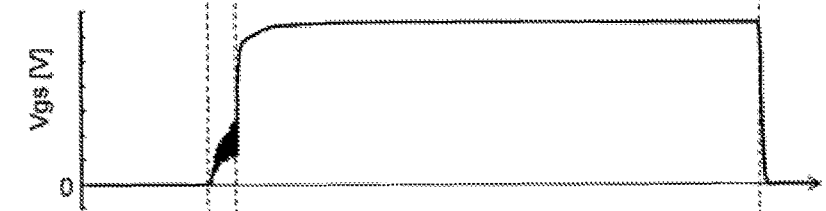

FIG. 18C is a graph showing the gate voltage Vgs of the rectification MOSFET 101. The gate voltage Vgs is also an output voltage at the CMOS buffer 161y at the final stage of the gate drive circuit 105y.

Figure 18D:
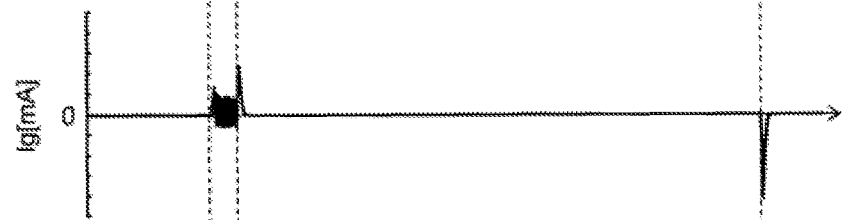

FIG. 18D is a graph showing a gate current Ig flowing from the gate drive circuit 105y toward the gate of the rectification MOSFET 101.

Figure 18E:
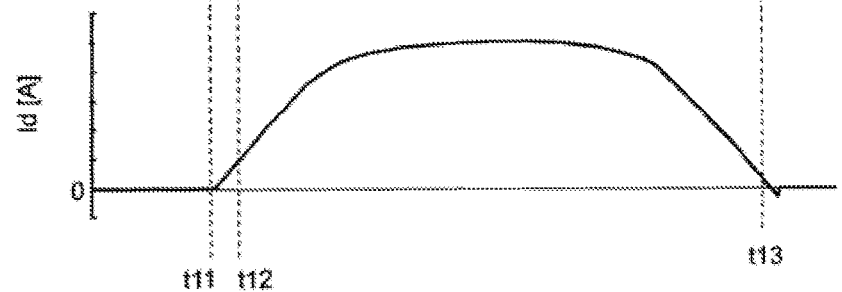

FIG. 18E is a graph showing the drain current Id of the rectification MOSFET 101. The drain current Id is a rectified current.

FIGS. 18A to 18E show the waveforms of the voltages and currents in the rectifier 132ul used in the low-side of the U-phase part 131u, but, waveforms of the voltages and currents in the rectifier 132uh used in the high-side of the U-phase part 131u is the same if the negative main terminal TL of the rectifier is taken as a reference. Each rectifier 132y that is used in low- and high-side of the V-phase part 131v and the W-phase part 131w is also the same in its waveform.

With reference to the waveforms of the voltage and current in the rectification circuit using the rectifier 132y of the autonomous type synchronous rectification MOSFET in the first comparative example, a description is made on the rectification and the problems of the rectifier 132y of the autonomous type synchronous rectification MOSFET.

In the control IC 108y used in the rectifier 132y of the autonomous type synchronous rectification MOSFET in the first comparative example, the CMOS buffer 161y in the final stage has a configuration in which the high-side P-type MOSFET 150 is the same in a channel length and twice in a channel width as the low-side N-type MOSFET 151, and both are equivalent to each other in its saturation current.

FIGS. 18A to 18E differ from FIGS. 19A to 19E in a timing of turning off the rectification MOSFET 101. FIGS. 18A to 18E show a case in which the drain voltage Vd of the rectification MOSFET 101 rises over its source voltage Vs and then the rectification MOSFET 101 is turned off. FIGS. 19A to 19E shows waveforms of a case in which the timing of turning off becomes earlier and the rectification MOSFET 101 is turned off before the drain voltage Vd of the rectification MOSFET 101 rises over its source voltage Vs.

Referring to FIG. 18A to 18E, a description is made on the rectification of the autonomous type synchronous rectification MOSFET.

The alternator 140 generates power by rotating the rotor coil 109 in the stator coils 110uv, 110vw, and 110wu. At this time, on the coil of each phase, an AC power is generated to cause the voltage at the midpoint line of each phase to fluctuate up and down periodically.

A voltage at the midpoint line is equal to that at the positive main terminal TH of the low-side rectifier and a voltage Vin+ at the non-inverted input terminal IN+ of the determination circuit 103.

A voltage at the negative terminal of the battery 111 is equal to that at the negative main terminal TL of the low-side rectifier and a voltage Vin− at the inverted input terminal IN− of the determination circuit 103.

At a time t11, the voltage at the midpoint line is under the voltage at the negative terminal of the battery 111. That is, as shown in FIG. 18A, the drain-source voltage Vds applied between the non-inverted input terminal IN+ and the inverted input terminal IN− of the determination circuit 103 becomes negative. As shown in FIG. 18B, the comparison signal Vcomp of the determination circuit 103 changes from H level to L level.

The comparison signal Vcomp of the determination circuit 103 is inputted to the gate drive circuit 105y, passed through the CMOS buffer 161y, or the like, and outputted. Thus, as shown in FIG. 18C, the gate voltage Vgs is boosted. The drain current Idh flows through the high-side P-type MOSFET 150 of the CMOS buffer 161y of the final stage and the like; and, as shown in FIG. 18D, the gate current Ig flows in the positive direction. This gate current Ig, as shown in FIG. 18C, boosts the gate voltage Vgs of the rectification MOSFET 101. When the gate voltage Vgs is boosted, the rectification MOSFET 101 is turned on, and, as shown in FIG. 18E, the drain current Id flows and the rectification starts. Then, during time t11 to t12, the comparison signal Vcomp is chattering.

At time t12, the comparison signal Vcomp becomes stable at L level and stops chattering. Thereafter, the voltage at the midpoint line is lowered and starts to rise.

At time t13, the voltage at the midpoint line rises over the voltage at the negative terminal of the battery 111. The voltage Vin+ at the non-inverted input terminal IN+ of the determination circuit 103 becomes higher than the voltage Vin− at the inverted input terminal IN−. Then, as shown in FIG. 18A, the drain-source voltage Vds becomes positive. Thus, as shown in FIG. 18B, the comparison signal Vcomp outputted by the determination circuit 103 is changed from L to H level.

The comparison signal Vcomp outputted by the determination circuit 103 is inputted to the gate drive circuit 105, passed through the CMOS buffer 161y, or the like, and outputted. Thus, as shown in FIG. 18C, the gate voltage Vgs is lowered. The drain current Idl flows through the low-side N-type MOSFET 151 of the CMOS buffer 161y of the final stage and the like; and, as shown in FIG. 18D, the gate current Ig flows in the inverse direction. This gate current Ig, as shown in FIG. 18C, lowers the gate voltage Vgs. When the gate voltage Vgs is lowered, the rectification MOSFET 101 is turned off, and, as shown in FIG. 18E, no drain current Id flows, and the rectification in the present cycle is finished.

Next, a description is made on problems of the autonomous type synchronous rectification MOSFET of the first comparative example.

At the time t11, when the rectification is started, the drain voltage Vd of the rectification MOSFET 101 becomes lower than the source voltage Vs, and then the determination circuit 103 and the gate drive circuit 105y starts to operate. When the drain current Id that is the rectified current starts to flow, the rectification MOSFET 101 is in the off state, first the rectified current flows through the built-in diode 102. An ON-voltage of the rectifier 132y is a voltage between the positive main terminal TH and the negative main terminal TL, and here appears a large voltage determined by the built-in diode 102 of a high resistance.

Thereafter, when the control IC 108y works to turn on the rectification MOSFET 101, the rectified current flows through the rectification MOSFET 101 with a low resistance. The ON-voltage of the rectifier 132y rapidly becomes a low voltage that is determined by the low on-resistance of the rectification MOSFET 101. The ON-voltage of the rectifier 132y becomes low and again meets criteria to turn off the rectification MOSFET 101, and thus the rectification MOSFET 101 is turned off. Since the rectification MOSFET 101 is turned off, the current flows through the built-in diode 102, the ON-voltage of the rectifier 132y becomes a large voltage that is determined by the built-in diode 102. As described above, the rectifier 132y repeats determinations of ON and OFF to cause the chattering during the time t11 to t12 as illustrated in FIGS. 18A to 18D. That is, the comparison signal Vcomp of the determination circuit 103 shown in FIG. 18B repeats transitions between the H and L levels, which varies the gate voltage Vgs of the rectification MOSFET 101 as shown in FIG. 18C, resulting in the vibration of the gate current Ig of the rectification MOSFET 101 shown in FIG. 18D.

The drain-source voltage Vds of the rectification MOSFET 101 shown in FIG. 18A also fluctuates because the rectified current flows alternately through the rectification MOSFET 101 and the built-in diode 102.

When the rectification is finished at the time t13, the rectification MOSFET 101 is turned off after the rectified current stops flowing, since the determination circuit 103 and the gate drive circuit 105y starts to work after the drain voltage Vd of the rectification MOSFET 101 rises over the source voltage Vs thereof. Therefore, no rapid increase of the ON-voltage of the rectifier occurs due to the current flowing through the built-in diode 102, and thus no chattering occurs like the period of the time t11 to t12.

However, the timing of the OFF determination is sometimes advanced, due to changes in temperature, a frequency of the generated AC power, and the battery voltage. In such a case, a chattering occurs similarly to the start time of the rectification described at the time t11 to t12, which case is shown in graphs of FIGS. 19A to 19E.

FIGS. 19A to 19E are the second graphs showing waveforms of respective parts of the rectifier of the first comparative example. The vertical and horizontal axes of each graph in FIGS. 19A to 19E are the same as those of each graph in FIG. 18A to 18E.

Operations at times t21 and t22 are the same as those at the times t11 and t12 shown in FIGS. 19A to 19E.

At time t23, even at the time of turning off the rectification MOSFET 101, the rectified current continues to flow through the built-in diode 102. The ON-voltage of the rectifier 132y rapidly changes from a low voltage determined by the small on-resistance of the rectification MOSFET 101 to a high voltage determined by the built-in diode 102. The high ON-voltage of the rectifier 132y meets the criteria to turn on the rectification MOSFET 101, and thus the rectification MOSFET 101 is turned on and a current flows through the rectification MOSFET 101. The ON-voltage of the rectifier 132y changes to a low voltage that is determined by the low on-resistance of the rectification MOSFET 101, and then, the rectification MOSFET 101 is again turned off. Repeating such determinations of ON/OFF-state causes the chattering to occur.

Figure 19A:
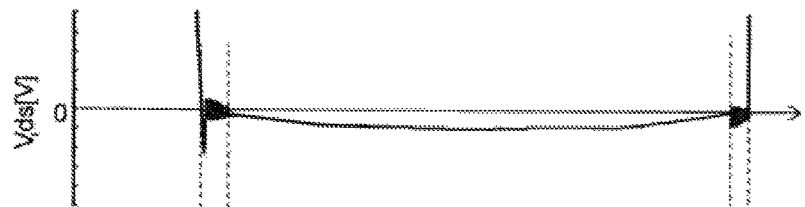
FIGS. 19A to 19E are graphs showing waveforms of respective parts of the rectifier of the first comparative example (Part 2).
Figure 19B:
Figure 19C:
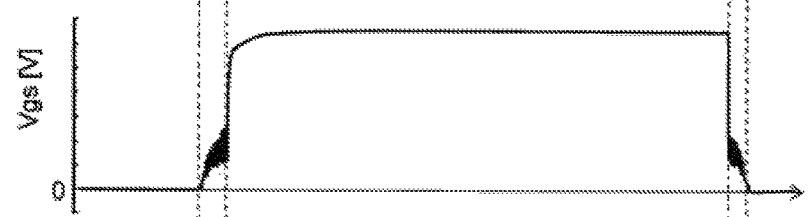
Figure 19D:
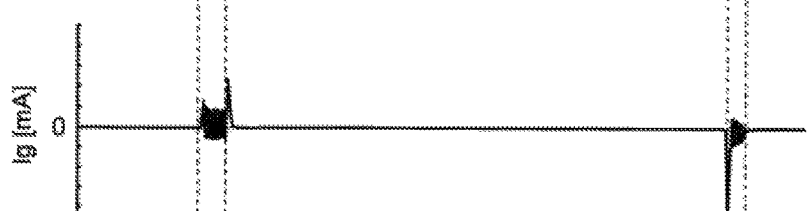
Figure 19E:
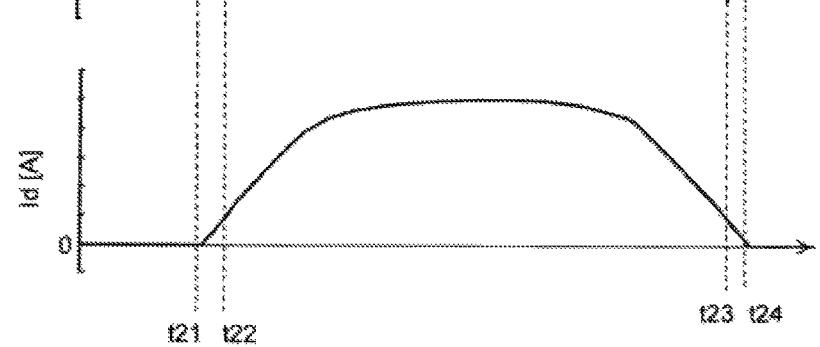

At time t24, when the drain-source voltage Vds shown in FIG. 19A becomes sufficiently high, the ON-voltage of the rectifier 132y is sufficiently so low that the chattering is stopped.

The rectifier 132y of the autonomous type synchronous rectification MOSFET performs ON/OFF determination referring to the drain-source voltage Vds of the rectification MOSFET 101. The chattering phenomenon during the time t21 to the time t22 or the time t23 to the time t24 is caused by the switching of the destination to which the rectified current flows between the rectification MOSFET 101 and the built-in diode 102.

The problem due to the chattering is in the vibration of the gate voltage Vgs of the rectification MOSFET 101, which increases the electric charge used to charge the gate to consume more electric charge of the capacitor 107 that works as the power supply of the gate drive circuit 105y. When the electric charge of the capacitor 107 is over-consumed so much that the voltage of the capacitor 107 becomes too low, the control IC 108y does not operate normally. It is necessary to increase the capacitance of the capacitor 107 in order to make the control IC 108y properly work even when the gate voltage Vgs of the rectification MOSFET 101 is varied, but this makes the size of the capacitor 107 large and a price of the capacitor 107 high. The small capacity of the capacitor 107 is essential to make the rectifier 132y small in area and low in cost, but the chattering is not allowed.

Another problem due to the chattering is a noise, which is generated by a source that is the vibrations of the drain-source voltage Vds and the drain current Id and sometimes affects the peripheral devices.

Figure 20:
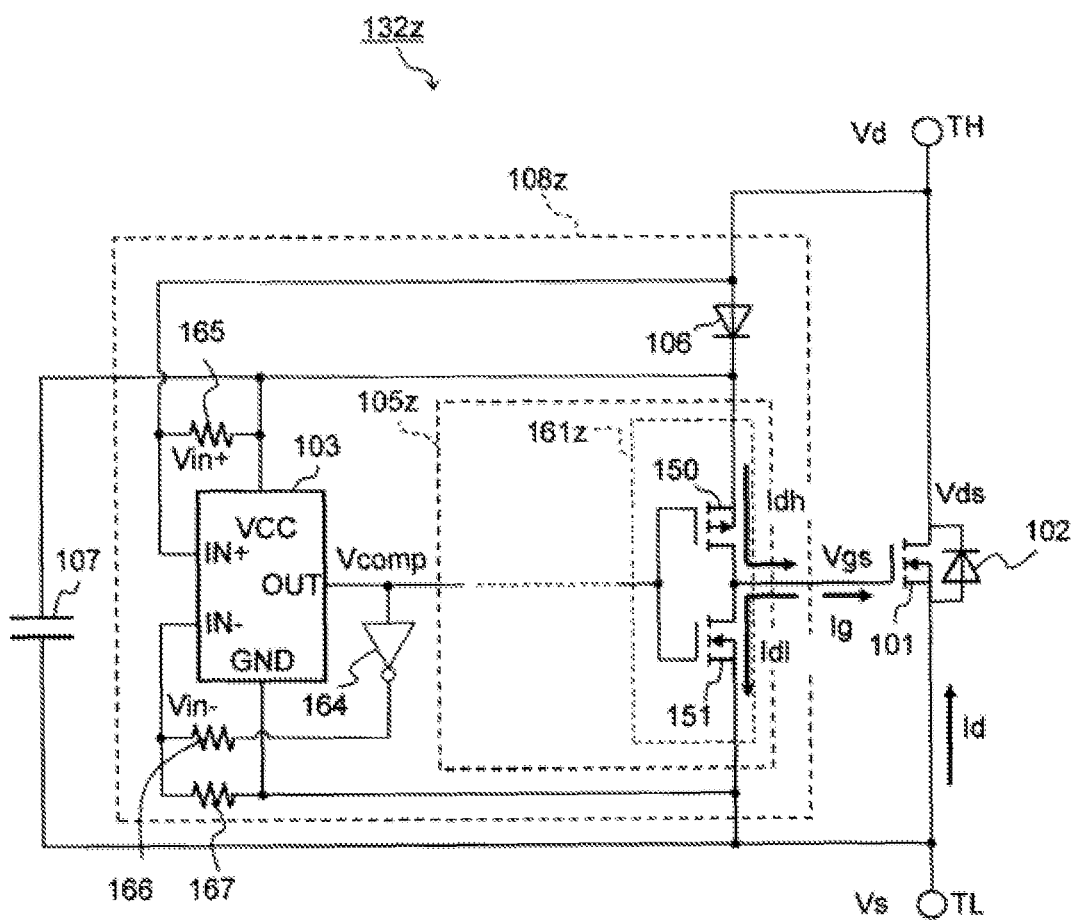
FIG. 20 is a circuit diagram showing a rectifier of autonomous type synchronous rectification MOSFET in a second comparative example.

FIG. 20 is a circuit diagram showing a rectifier 132z of the autonomous type synchronous rectification MOSFET in the second comparative example. The same reference signs are assigned to the same elements as the rectifier 132y of the first comparative example shown in FIG. 14.

As shown in FIG. 20, the rectifier 132z of the second comparative example is configured to include a control IC 108z different from that of the first comparative example shown in FIG. 17. The control IC 108z of the second comparative example is different from the first comparative example shown in FIG. 17 in that the determination circuit 103 is provided with a hysteresis.

Note that the control IC 108z of the second comparative example has the same structure as that of the control IC 108y of the first comparative example. A CMOS buffer 161z of the second comparative example has the same structure as that of the CMOS buffer 161y of the first comparative example.

A resistor 165 is connected between the non-inverted input terminal IN+ and the power supply voltage terminal VCC of the determination circuit 103. The output terminal OUT of the determination circuit 103 is connected with a CMOS inverter 164 and fed back to the inverted input terminal IN− through a resistor 166. The inverted input terminal IN− is connected to the negative main terminal TL through a resistor 167.

A hysteresis voltage is determined by a resistance value of the resistor 166 and a value of a current flowing through the resistor 166. The resistor 165 is used to lift the voltage Vin+ at the non-inverted input terminal IN+ of the determination circuit 103 for regulating an OFF-timing by the amount of the hysteresis voltage.

FIGS. 21A to 28E are graphs showing waveforms of respective parts of the rectifier 132z of the second comparative example. The vertical and horizontal axes of each graph in FIGS. 21A to 28E are the same as the vertical and horizontal axes of each graph in FIGS. 18A to 18E. A thick broken line in FIG. 21A indicates the comparison voltage of the determination circuit 103.

Figure 21A:
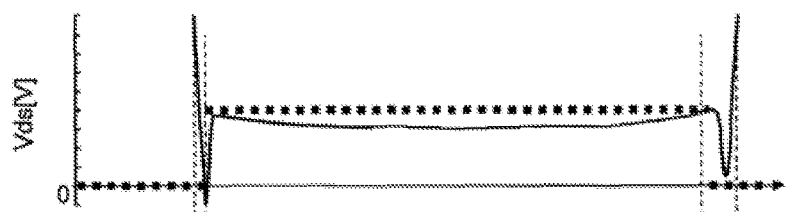
FIGS. 21A to 21E are graphs showing waveforms of respective parts of the rectifier of the second comparative example.
Figure 21B:
Figure 21C:
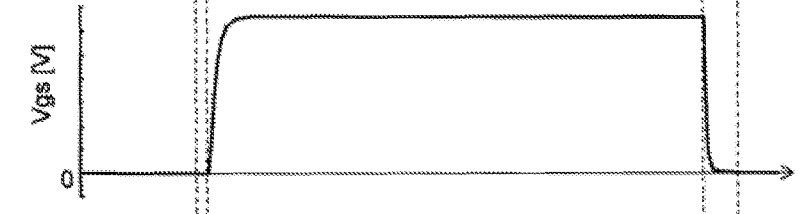
Figure 21D:
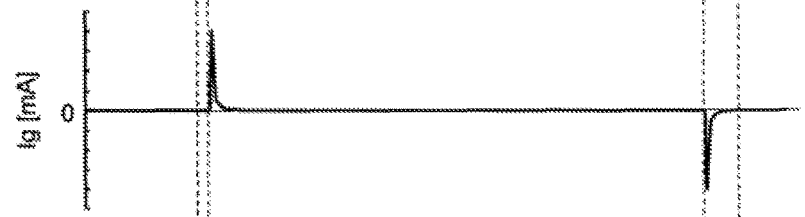
Figure 21E:
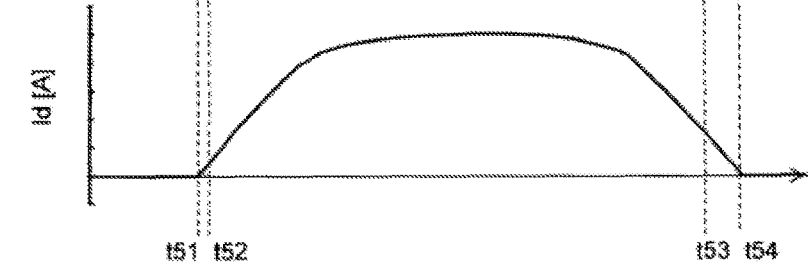

As shown in the waveform of FIG. 21A, when the voltage Vin+ at the non-inverted input terminal IN+ of the determination circuit 103 becomes lower than the voltage Vin− at the inverted input terminal IN−, the determination circuit 103 makes a determination such that the rectification MOSFET 101 is turned on. This boosts the voltage Vin− at the inverted input terminal IN− by the amount of the hysteresis voltage and also boosts the comparison voltage.

When the voltage Vin+ at the non-inverted input terminal IN+ of the determination circuit 103 becomes higher than the voltage Vin− at the inverted input terminal IN−, the determination circuit 103 makes a determination such that the rectification MOSFET 101 is turned off. This lowers the boosted voltage Vin− at the inverted input terminal IN− by the amount corresponding to the hysteresis voltage and the comparison voltage is also lowered.

The voltage Vin+ at the non-inverted input terminal IN+ of the determination circuit 103 is boosted by the amount of the hysteresis voltage in order to adjust the OFF timing. The determination circuit 103 suppresses the rectification MOSFET 101 from turning OFF to prevent the chattering by boosting the voltage Vin− at the inverted input terminal IN− after the rectification MOSFET 101 is turned on. The determination circuit 103 suppresses the rectification MOSFET 101 from turning ON to prevent the chattering by lowering the voltage Vin− at the inverted input terminal IN− after the rectification MOSFET 101 is turned off.

The hysteresis voltage needs to be greater than the ON-voltage of the built-in diode 102, specifically, to be set to at least 0.8 V, in order to prevent the chattering from occurring when the rectification is finished.

In the rectifier 132z of the second comparative example, when the rectification is finished, once the rectification MOSFET 101 is turned off, the OFF-state continues, the rectified current flows to the built-in diode 102 after the rectification MOSFET 101 is turned off. If the timing for turning off the rectification MOSFET 101 is earlier, a large current, which corresponds to several tens of percent of the peak of the rectified current, sometimes flows.

Every time when the rectifier 132z repeats the rectification, such a large current flows through the built-in diode 102. Such an electric conduction in the built-in diode 102 causes a problem of an increasing loss and an increasing amount of heat.

In addition, in the rectifier 132z of the second comparative example, when the rectification starts, the timing of turning on the rectification MOSFET 101 is delayed by the hysteresis voltage. Therefore, if a large current flows through the built-in diode 102 before the rectification MOSFET 101 is turned on, the electric conduction in the built-in diode 102 may cause a problem of an increasing loss and an increasing amount of heat as when the rectification is finished.

Further, the rectifier 132z of the second comparative example may provide no effect of preventing the through-current from flowing through the rectifiers 132z of the high-side and low-side when the rectification MOSFET 101 transitions into the OFF-state upon application of a noise. In addition, the rectifier 132z of the second comparative example needs to have the capacity of the capacitor 107 increased by an amount corresponding to the increased current consumption generally accompanying to the circuit that is added to implement the hysteresis.

Figure 2:
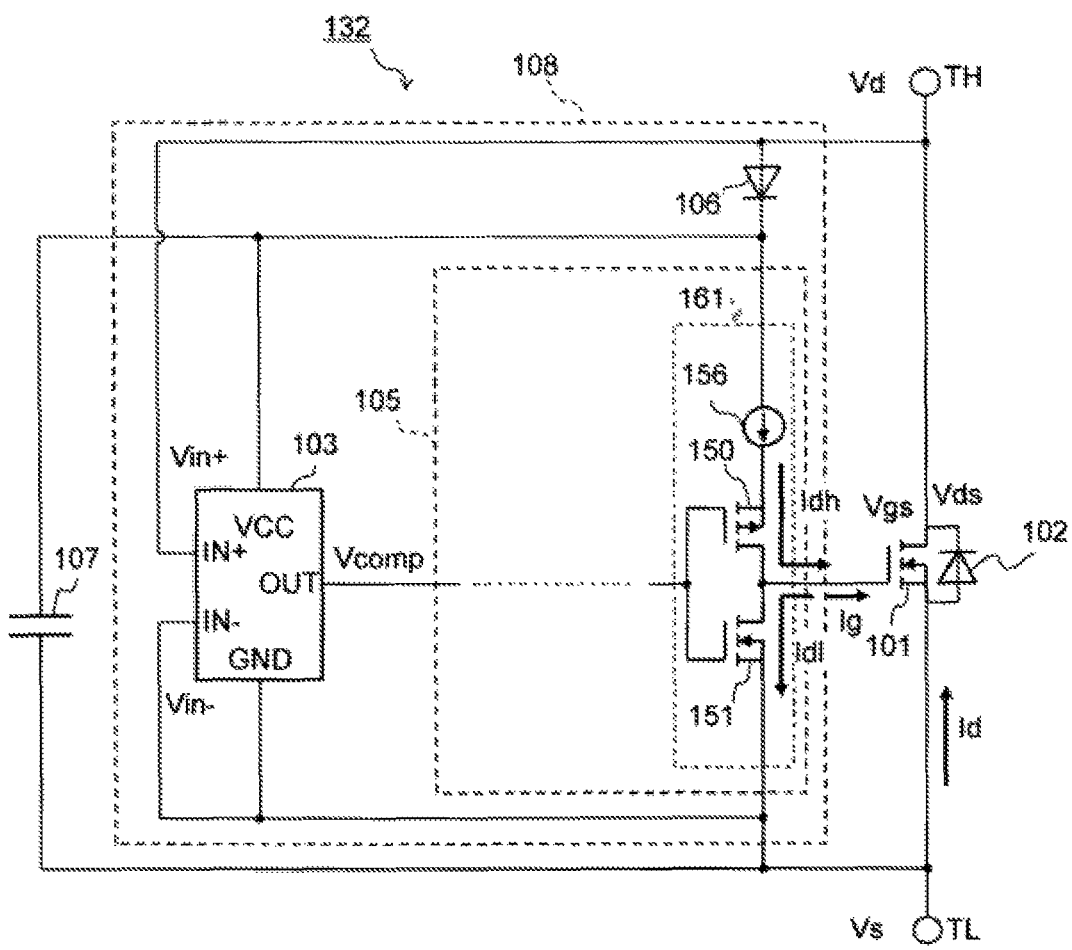
FIG. 2 is a circuit diagram showing a rectifier of an autonomous type synchronous rectification MOSFET of a first embodiment.

FIG. 2 is a circuit diagram showing a rectifier of the autonomous type synchronous rectification MOSFET of the first embodiment.

As shown in FIG. 2, the rectifier 132 of the autonomous type synchronous rectification MOSFET in the first embodiment is configured to include two of terminals of the positive main terminal TH and the negative main terminal TL, the rectification MOSFET 101, the built-in diode 102 incorporated in the chip of the rectification MOSFET 101, the determination circuit 103, a gate drive circuit 105, the diode 106, and the capacitor 107.

The power MOSFET is used for the rectification MOSFET 101 in order to let a large current generated by the generation part of the alternator 140. The rectification MOSFET 101 performs the synchronous rectification. The rectification MOSFET 101 has a drain connected to the positive main terminal TH and a source connected to the negative main terminal TL. Thereby, the built-in diode 102 of the rectification MOSFET 101 has its anode connected to the negative main terminal TL and its cathode connected to the positive main terminal TH.

The determination circuit 103 has a non-inverted input terminal IN+ connected to the drain of the rectification MOSFET 101, an inverted input terminal IN− connected to the source of the rectification MOSFET 101. An output terminal OUT of the determination circuit 103 is connected to an input terminal of the gate drive circuit 105. The output terminal OUT of the determination circuit 103 outputs the comparison signal Vcomp. The determination circuit 103 performs a direct comparison of the non-inverted input terminal IN+ with the inverted input terminal IN− to generate the determined comparison signal Vcomp. Thereby, the determination circuit 103 outputs a comparison result of the source voltage Vs at the negative main terminal TL with the drain voltage Vd at the positive main terminal TH. The determination circuit 103 is preferably of high precision performance.

The diode 106 is connected with the positive main terminal TH and a positive terminal of the capacitor 107 in a direction from the positive main terminal TH toward the positive terminal of the capacitor 107. The positive terminal of the capacitor 107 is connected to a power supply voltage terminal VCC of the determination circuit 103 and the gate drive circuit 105y to supply DC power.

The output terminal of the gate drive circuit 105 is connected to the gate of the rectification MOSFET 101. The gate drive circuit 105 outputs the gate voltage Vgs. The gate drive circuit 105 is configured to include one or more CMOS (Complementary MOS) buffers. Here is illustrated a CMOS buffer 161 at the final stage.

The CMOS buffer 161 at the final stage (the first CMOS buffer) is configured to include a circuit serially connecting: a constant-current circuit 156, the high-side P-type MOSFET 150, and the low-side N-type MOSFET 151. The CMOS buffer 161 at the final stage has the high-side P-type MOSFET 150 and the low-side N-type MOSFET 151 connected in series, and connects the constant-current circuit 156 with the high-side P-type MOSFET 150 in series. The constant-current circuit 156 is connected to the high-side P-type MOSFET 150 in series and placed in a path of the drain current Idh for turning on the gate of the rectification MOSFET 101. The constant-current circuit 156 may be connected to either the source or the drain of the high-side P-type MOSFET 150.

The high-side P-type MOSFET 150 and the low-side N-type MOSFET 151 is configured to have the same channel length and the channel widths whose ratio is 2:1.

A current passed by the constant-current circuit 156 is made less than a saturation current of the high-side P-type MOSFET 150 to limit the drain current Idh in a predetermined ratio.

When the rectification MOSFET 101 is turned on, the gate current Ig flows through the constant-current circuit 156 and into the high-side P-type MOSFET 150. This gate current Ig is limited by the constant-current circuit 156. When the rectification MOSFET 101 is turned off, the gate current Ig flows into the low-side N-type MOSFET 151. This gate current Ig is not limited by the constant-current circuit 156.

The use of the constant-current circuit 156 is able to limit the current flowing in the high-side P-type MOSFET 150 to the predetermined current value of the constant-current circuit 156, which makes a design easy, reduces an influence due to element dispersion, and reduces a temperature dependency.

The constant-current circuit 156 may be suitably configured by using, for example, an N-type depletion mode MOSFET whose gate is shorted to its source, or a current mirror circuit in which a MOSFET gate is connected in common with that of the other constant current part.

The non-inverted input terminal IN+ of the determination circuit 103 is connected to the drain terminal of the rectification MOSFET 101 without an interposition of a resistor; and the inverted input terminal IN− of the determination circuit 103 is connected to the source terminal of the rectification MOSFET 101 without an interposition of a resistor, which enables preventing a voltage fluctuation at the input terminal of the determination circuit 103 due to the resistance dispersion and the temperature dependency.

The control IC 108 is configured to include the determination circuit 103, the gate drive circuit 105, and the diode 106; and made of a single silicon chip. Such a configuration of a one-chip IC provides benefits of low cost, small area, and high noise immunity.

The capacitor 107 supplies power for driving the control IC 108. Using the capacitor 107 for the power supply makes the number of terminals of the rectifier 132 become two and allows a compatibility with the number of a conventional rectification diode used in the alternator 140, which enables replacement of a conventional rectification diode with the rectifier 132 and an improvement of a performance of the alternator 140.

Alternatively, the power for the control IC 108 may be supplied from an external power source instead of the capacitor 107, by adding one terminal to the rectifier 132. This allows a more stable power supply for the rectifier 132.

A chattering in this rectifier 132 causes vibrations of the comparison signal Vcomp outputted by the determination circuit 103 and the gate voltage Vgs outputted by the gate drive circuit 105. This causes consuming of the energy (charge) accumulated by the capacitor 107, leading to a risk that the control IC 108 is inoperable. It is necessary to adopt a large capacitance of capacitor for the capacitor 107 in order to surely supply the control IC 108 with secure power even if the chattering occurs, but this needs a large mount area of the capacitor 107 and a high cost for the rectifier 132.

The rectifier 132 of the first embodiment allows the capacitor 107 to have a small capacitance by preventing the chattering, and further can afford to supply the power to the control IC 108, which achieves the rectifier 132 having a small area and low cost, and further can suppress an occurrence of a noise due to the vibration of the voltage and current.

The rectifier 132 may have a diode for absorbing a surge connected in parallel with the rectification MOSFET 101. Such a configuration may provide the rectifier 132 with a surge absorbing function.

The number of the stages of the CMOS buffers constituting the gate drive circuit 105 may be set to a plurality of stages, for example, 3 stages.

Figure 3:
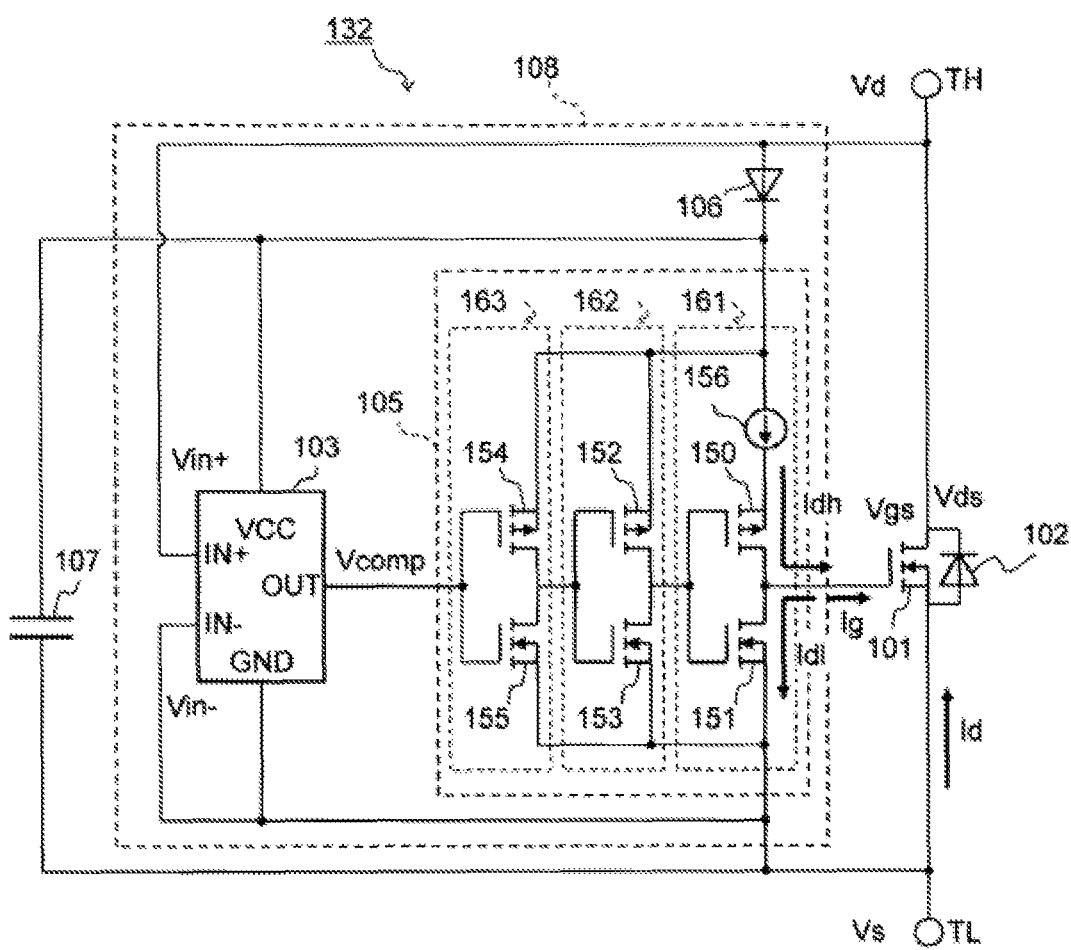
FIG. 3 is a diagram showing a rectifier of the autonomous type synchronous rectification MOSFET of the first embodiment.

FIG. 3 is a diagram showing a rectifier for the autonomous type synchronous rectification MOSFET that is a modification example of the first embodiment. The modification example of the first embodiment shown in FIG. 3 shows a configuration in which the rectifier of the autonomous type synchronous rectification MOSFET of the first embodiment shown in FIG. 2 has the gate drive circuit 105 configured with three stages of the CMOS buffer.

The gate drive circuit 105 includes a CMOS buffer 161 of the final stage, a CMOS buffer 162 placed at one stage before the final stage, and a CMOS buffer 163 placed at two-stage before the final stage to be configured in the three stages of CMOS buffer. The gate drive circuit 105 is configured with three stages (odd number of stages) of the CMOS buffers 161 to 163 to output an inverse of the input signal.

The CMOS buffer 161 of the final stage (the first CMOS buffer) is configured to include a circuit which connects in series the constant-current circuit 156, the high-side P-type MOSFET 150, and a low-side N-type MOSFET 151. The CMOS buffer 162 at one stage before the final stage (the second CMOS buffer) is configured to include a circuit which connects in series the high-side P-type MOSFET 152 and a low-side N-type MOSFET 153. The CMOS buffer 163 at two stages before the final stage (the third CMOS buffer) is configured to include a circuit which connects in series the high-side P-type MOSFET 154 and a low-side N-type MOSFET 155.

The CMOS buffers 161 to 163 have MOSFETs configured to have all the same channel lengths, and to have the high-side P-type MOSFET and the low-side N-type MOSFET in the same CMOS buffer whose ratios of the channel widths are respectively 2:1.

The channel widths of the high-side P-type MOSFETs and the low-side N-type MOSFETs are arranged such that the channel width of the MOSFETs at the rear stage is sequentially becoming larger than the preceding stage at the same rate (for example, four times). This makes each CMOS buffer easy to drive and reduces an overall delay of the gate drive circuit 105.

For example, the channel width of the high-side P-type MOSFET 150 at the final stage is 128 um, and the channel width of the low-side N-type MOSFET 151 is 64 um; the channel width of the high-side P-type MOSFET 152 at one stage before the final stage is 32 um, and the channel width of the low-side N-type MOSFET 153 is 16 um; the channel width of the high-side P-type MOSFET 154 at two stage before the final stage is a 8 um, and the channel width of the low-side N-type MOSFET 155 is 4 um.

The above-described configuration allows for reducing the delay of the gate drive circuit 105 at both times when the rectification MOSFET 101 is turned on and turned off. The shorter delay of the gate drive circuit 105 at the time of turning off the rectification MOSFET 101 enables reducing the temperature dependency and the dependency on the operating frequency of the timing when the rectification MOSFET 101 is turned off, and enables an operation at a wide range of temperatures and operating frequencies required for the alternator 140.

Note that the rectifier 132 may have the determination circuit 103 with the non-inverted input terminal IN+ connected to the negative main terminal TL, and the inverted input terminal IN− connected to the positive-side main terminal TH. That is, the rectifier 132 may be configured to output a comparison signal Vcomp having a polarity inverted from that of the first embodiment. In this case, the gate drive circuit 105 is configured to include, for example, even-numbered stages of the CMOS buffer to output a gate voltage Vgs without inverting the input signal.

FIGS. 4A to 4E are first graphs showing waveforms of the respective parts of the rectifier 132 of the first embodiment (Part 1).

FIGS. 5A to 5E are second graphs showing waveforms of the respective parts of the rectifier 132 of the first embodiment (Part 2).

Vertical and horizontal axes of respective graphs in FIGS. 4A to 4E and FIGS. 5A to 5E are the same as the vertical and horizontal axes in respective graphs of FIG. 18A to 18E.

FIGS. 4A to 4E and FIGS. 5A to 5E show waveforms of a case in which the timing of turning off becomes earlier and the rectification MOSFET 101 is turned off before the drain voltage Vd of the rectification MOSFET 101 rises over its source voltage Vs.

Now, with reference to FIGS. 4A to 4E, a confirmation is made on an operation and an effect of the rectifier 132 using the autonomous type synchronous rectification MOSFET of the first embodiment.

At time t31, when the rectifier 132 starts rectification, the voltage Vin+ at the non-inverted input terminal IN+ of the determination circuit 103 is lower than the voltage Vin− at the inverted input terminal IN− thereof. At this time, as shown in FIG. 4A, the drain-source voltage Vds becomes negative.

Figure 4A:
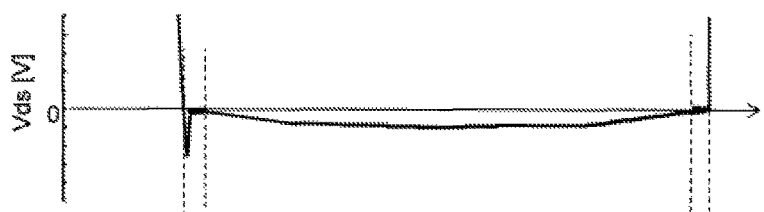
FIGS. 4A to 4E are graphs showing waveforms at respective parts of the rectifier of the first embodiment (Part 1).
Figure 4B:
Figure 4C:
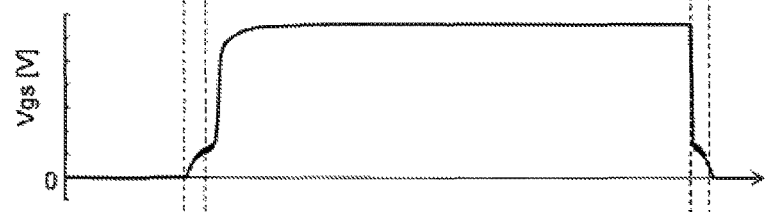

As shown in FIG. 4B, the comparison signal Vcomp of the determination circuit 103 changes from H to L level. The comparison signal Vcomp of the determination circuit 103 is passed through each of the CMOS buffers 163, 162, 161 in the gate drive circuit 105, and then, as shown in FIG. 4C, the gate voltage Vgs is boosted. At this time, the drain current Idh flows through the high-side P-type MOSFET 150 of the CMOS buffer 161 of the final stage to become the gate current Ig. This gate current Ig boosts the gate voltage Vgs of the rectification MOSFET 101.

Figure 4D:
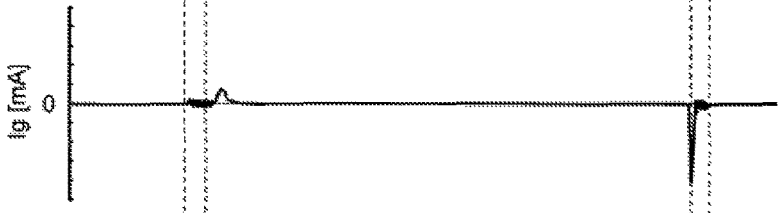
Figure 4E:
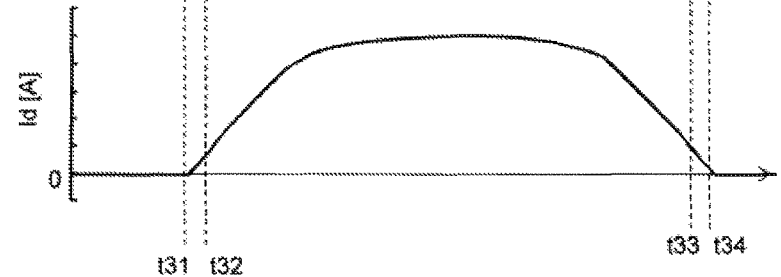

In the rectifier 132 of the first embodiment, the constant-current circuit 156 is connected in series with the high-side P-type MOSFET 150 of the CMOS buffer 161 at the final stage, allows for flowing of a current smaller than a current which is allowed to flow through the high-side P-type MOSFET 150 to limit the drain current Idh (gate current Ig) of the rectification MOSFET 101. Therefore, the boosting rate of the gate voltage Vgs of the rectification MOSFET 101 becomes so slow to be unable to follow the vibration of the comparison signal Vcomp of the determination circuit 103. Accordingly, a filter effect of slowing a response of the output enables the vibration of the gate voltage Vgs to be suppressed. Furthermore, switching of currents between the built-in diode 102 and the rectification MOSFET 101 may be also suppressed to result in the suppression of the vibration of the drain-source voltage Vds, as shown in FIG. 4A. Suppressing the vibration of the gate voltage Vgs of the rectification MOSFET 101 also allows for suppressing the vibration of the gate current Ig, as shown in FIG. 4D, which results in the reduction of the unnecessary consumption of the charge in the capacitor 107.

At time t32, as shown in FIG. 4A, the drain-source voltage Vds becomes sufficiently smaller than 0 volt. And as shown in FIG. 4B, the comparison signal Vcomp is stabilized at L level and stops chattering.

At time t33, when the rectifier 132 finishes the rectification, the determination of OFF-state of the rectification MOSFET 101 is so early that the comparison signal Vcomp fluctuates to cause a chattering to occur in the same way as when the rectification starts during time t31 to t32. However, the filter effect of slowing the response of the output enables suppressing the vibration of the gate voltage Vgs. As the result, the vibration of the drain-source voltage Vds and the gate current Ig of the rectification MOSFET 101 can be suppressed, resulting in the reduction of the unnecessary consumption of the electric charge of the capacitor 107.

At time t34, as shown in FIG. 4A, the drain-source voltage Vds becomes sufficiently higher than 0 volt; and as shown in FIG. 4B, the comparison signal Vcomp is stabilized at H level to stop the chattering.

Next, referring to FIGS. 5A to 5E, a confirmation is made on an operation and effect of the autonomous type synchronous rectification MOSFET of the present invention.

At time t41, when the rectifier 132 starts the rectification, the voltage Vin+ at the non-inverted input terminal IN+ of the determination circuit 103 is lower than the voltage Vin− at the inverted input terminal IN− thereof, similarly to the case shown in FIGS. 4A to 4E. And as shown in FIG. 5A, the drain-source voltage Vds becomes negative.

As shown in FIG. 5B, the comparison signal Vcomp of the determination circuit 103 changes from H to L level. The comparison signal Vcomp of the determination circuit 103 is passed through each of the CMOS buffers 163, 162, 161 in the gate drive circuit 105, and then, as shown in FIG. 5C, the gate voltage Vgs is boosted. At this time, the drain current Idh flows through the high-side P-type MOSFET 150 of the CMOS buffer 161 of the final stage to become the gate current Ig. This gate current Ig boosts the gate voltage Vgs.

If a current of the constant-current circuit 156 that is connected in series with the high-side P-type MOSFET 150 of the CMOS buffer 161 at the final stage is lower than that in FIGS. 4A to 4E, the gate current Ig, as shown in FIGS. 5A to 5E, is further limited to further slow down the boosting rate of the gate voltage Vgs. In this case, switching of the path of the rectified current from the built-in diode 102 to the rectification MOSFET 101 may be delayed; and the larger rectified current flows. Then, the ON-voltage of the rectification MOSFET 101 becomes larger when the switching occurs from the built-in diode 102 to the rectification MOSFET 101, and thus, the determination circuit 103 rarely performs the OFF determination, resulting in the suppression of the chattering.

During the time from t42 to t43, when the rectifier 132 finishes the rectification, the operation is the same as that during the time from t33 to t34 as shown in FIGS. 4A to 4E. The filter effect of slowing the response of the output enables suppressing the vibration of the gate voltage Vgs, as shown in FIG. 5C; the vibration of the gate current Ig is also further suppressed as shown in FIG. 5D; and thus, the vibration of the drain-source voltage Vds is also further suppressed as shown in FIG. 5A.

As described above with reference to FIGS. 4A to 4E and FIGS. 5A to 5E, the rectifier 132 of the first embodiment has the effect of suppressing the chattering at the beginning and end of the rectification. As a result, the unnecessary consumption of the charge in the capacitor 107 can be reduced to achieve the rectifier 132 that operates with a small capacitor and needs only a small area and a low cost.

Furthermore, the rectifier 132 of the first embodiment may suppress the occurrence of the noise due to the vibration of the voltage and current.

The frequency of the AC power generated by the alternator 140 is approximately 50 Hz at lowest and 5 kHz even at highest. A change in the phase voltage of the AC power generated by the alternator 140 is so slow that the rectified current is increased gradually after the rectification MOSFET 101 is turned on. Thus, the ON-operation of the rectification MOSFET 101 shows no transient behavior. Therefore, the rectifier 132 of the first embodiment, even if the timing of turning on the rectification MOSFET 101 is delayed, has a small switching loss and a small rectification loss when turning on. The delayed timing of turning on the rectification MOSFET 101 extends the period in which the current flows through the built-in diode 102 that has a larger conduction loss than the rectification MOSFET 101, but the period is immediately after the rectification is started and the rectified current at that period is small. Therefore, even if the conduction loss of the built-in diode 102 becomes larger, the whole rectification loss is almost unchanged. In addition, because there is enough time for the rectified current to reach a peak, an insufficient increase of the gate voltage Vgs is unlikely to increase the rectification loss. That is, if the alternator 140 uses the rectifier 132 of the autonomous type synchronous rectification MOSFET of the first embodiment, the effect of preventing the chattering may be obtained without a significant disadvantage.

The rectifier 132 of the first embodiment also provides an effect of preventing a through-current in the rectifier of the high-side and low-side when a noise is applied. The rectifier 132 determines the ON/OFF-state of the rectification MOSFET 101 referring to the drain-source voltage Vds of the rectification MOSFET 101. At this time, the erroneous determination of the determination circuit 103 sometimes causes a malfunction of the rectification MOSFET 101. Specifically, if a noise is applied on the positive main terminal TH and the negative main terminal TL of the rectifier 132, the comparison signal Vcomp of the determination circuit 103 is sometimes inverted, resulting a switching of ON/OFF-state of the rectification MOSFET 101.

If a noise is applied on the rectification MOSFET 101 in an ON-state to cause a malfunction, there occurs no problem for the rectification during the period in which the rectification MOSFET 101 malfunctions to stay in an OFF-state, because the rectified current flows through the built-in diode 102 of the rectification MOSFET 101. In contrast, if a noise is applied on the rectification MOSFET 101 in the OFF-state to cause a malfunction, and if the rectification MOSFET 101 in the other arms is in the ON-state, a through-current flows through the rectification MOSFETs 101 at the high-side and low-side from the positive terminal of the battery 111 to its negative terminal. The through-current flows in this way not only causes a power loss due to losing an electricity charged in the battery 111, but also sometimes causes a great current to flow in the rectification MOSFETs 101 with a low resistance at the high-side and low-side to destroy the rectifier 132. The alternator 140 has various devices connected between the positive terminal and the negative terminal of the battery 111 that may generate a noise, and thus, noise suppression is important.

The rectifier 132 of the first embodiment needs a longer time for boosting the gate voltage Vgs when the rectification MOSFET 101 is turned on; and a short time for stepping down the gate voltage Vgs when the rectification MOSFET 101 is turned off. Therefore, if a noise enters the rectification MOSFET 101 in the ON-state to cause a malfunction, the rectification MOSFET 101 is turned off in a short time, and then the rectification MOSFET 101 returns to ON-state in a long time after the noise disappears. During the period that the rectification MOSFET 101 is turned off, the rectified current flows in the built-in diode 102 of the rectification MOSFET 101 and the rectification is carried out without any problems. When a current flows through the built-in diode 102, the heat generation is larger than when the current is flowing to the rectification MOSFET 101, and thus a design of the chip and heat resistance of the rectification MOSFET 101 needs to be conducted so that this heat causes no problems.

On the other hand, if a noise enters the rectification MOSFET 101 in the OFF-state to cause a malfunction, the determination circuit 103 wrongly determines the ON-state, but it takes a long time for the rectification MOSFET 101 to be turned on. If the noise disappears before the gate voltage Vgs of the rectification MOSFET 101 exceeds a threshold voltage of the rectification MOSFET 101, the determination circuit 103 keeps to determine that the rectification MOSFET 101 is in the OFF-state, and the rectification MOSFET 101 returns to the OFF-state in a short time without the rectified current flowing through the rectification MOSFET 101. That is, since the rectified current does not flow through the rectification MOSFET 101 while the noise is applied, the through-current between the high-side and low-side can be suppressed. The speed for the rectification MOSFET 101 to be turned on should be set so that the gate voltage Vgs of the rectification MOSFET 101 does not exceed the threshold voltage of the rectification MOSFET 101 before the envisaged noise application period ends.

In the rectifier 132 of the autonomous type synchronous rectification MOSFET of the first embodiment, a time required for boosting the gate voltage Vgs when the rectification MOSFET 101 is turned on is long, and a time required for the stepping-down the gate voltage Vgs when the rectification MOSFET 101 is turned off is short. Further, to suppress the current from switching a flow path between the rectification MOSFET 101 and the built-in diode 102 during the chattering, and to prevent a through-current from flowing through the high-side and low-side rectification MOSFETs 101 during the noise is applied, it is important to increase a time from when the gate voltage Vgs of the low-side rectification MOSFET 101 starts to drop until it reaches a threshold voltage Vth. Similarly, it is important to increase a time from when the gate voltage Vgs of the high-side rectification MOSFET 101 starts to rise until when it reaches the threshold voltage Vth.

Let define a time required for stepping-down the gate voltage Vgs when the rectification MOSFET 101 is turned on as a time from when the gate voltage Vgs becomes 90% of the maximum gate voltage until when it reaches the threshold voltage Vth. Let define a time required for boosting the gate voltage Vgs when the rectification MOSFET 101 is turned off as a time from when the gate voltage Vgs becomes 10% of the maximum gate voltage until it reaches the threshold voltage Vth. Here, it is important that the time required for boosting the gate voltage Vgs when the rectification MOSFET 101 is turned on is longer than the time required for stepping-down the gate voltage Vgs when the rectification MOSFET 101 is turned off.

FIGS. 6A to 6G are graphs showing through-currents flowing through the rectifier 132 of the first embodiment and the rectifier 132z of the comparative examples.

FIG. 6A is a graph showing a waveform of the voltage Vu of the midpoint line (node Nu) of the U-phase part 131u.

FIG. 6B is a graph showing a waveform of a comparison signal VcompH of the high-side rectifier 132uh.

FIG. 6C is a graph showing a waveform of the gate voltage VgsH of the gate drive circuit 105 of the high-side rectifier 132uh. The gate voltage VgsH is based on the source voltage Vs of the rectification MOSFET 101uh.

FIG. 6D is a graph showing a drain current IdH flowing in the high-side rectifier 132uh.

FIG. 6E is a graph showing a waveform of a comparison signal VcompL of the low-side rectifier 132ul.

FIG. 6F is a graph showing a waveform of the gate voltage VgsL of the gate drive circuit 105 of the low-side rectifier 132ul. The gate voltage VgsL is based on the source voltage Vs of the rectification MOSFET 101ul.

FIG. 6G is a graph showing the drain current IdL flowing in the low-side rectifier 132ul.

The voltage and current of the V-phase part 131v has the same waveform as those of the U-phase part 131u and the phase is shifted by 120 degree. The voltage and current of the W-phase part 131w has the same waveform as the U-phase part 131u and the phase is shifted by 240 degree.

Referring appropriately to the alternator 140 shown in FIG. 1, a description is made on operations of the respective parts operated by a voltage and current.

The alternator 140 generates power by rotating the rotor coil 109 in the stator coils 110uv, 110vw, and 110wu. At this time, AC power is generated on the stator coils 110uv, 110vw, and 110wu.

As shown in FIG. 6A, AC power on the stator coils 110uv, 110vw, and 110wu causes the voltage Vu at the midpoint line (node Nu) of the U-phase part 131u to fluctuate up and down periodically. The rectifier 132 and 132z, in order to prevent a through-current, operates in the opposite direction to the direction of the rectification to prevent the current from flowing.

At a time t60, when the voltage Vu becomes lower than 0 V, prior to controlling to turn on the rectification MOSFET 101ul at the start time of the synchronous rectification, first of all, a current flows through the built-in diode 102ul with a high resistance, which increases the ON-voltage. When the ON-voltage is increased, the rectification MOSFET 101ul of the low-side rectifier 132ul is turned on, and synchronous rectification is started. Then, a current flows through the low-resistance rectification MOSFET 101ul to cause the ON-voltage to fall. When the ON-voltage becomes too low, the ON-voltage reaches a voltage of the criteria to turn off the rectification MOSFET 101ul. The rectification MOSFET 101ul is turned off, and the synchronous rectification is finished. This causes a current to flow through the built-in diode 102ul and the ON-voltage to increase, and the rectification MOSFET 101ul is turned on, and the synchronous rectification is started again. Thus the rectification MOSFET 101ul repeats ON and OFF until the voltage Vu becomes sufficiently low.

Here is considered a case in which, at time t61 to t62, a noise causes the determination circuit 103 to malfunction and the comparison signal VcompH shown in FIG. 6B becomes L level. In FIGS. 6C and 6D, the dashed line shows the behavior of the rectifier 132y of the first comparative example (see FIG. 17). In contrast, a solid line in FIGS. 6C and 6D shows a behavior of the rectifier 132 of the first embodiment (see FIG. 2).

As shown in FIG. 6C, the rectifier 132y of the first comparative example has a possibility of the gate voltage VgsH exceeding the threshold voltage Vth to cause a through-current to flow when a noise is applied. In contrast, the rectifier 132 of the first embodiment gradually increases the gate voltage VgsH, which does not exceed the threshold voltage Vth, even when a noise is applied.

As shown in FIG. 6D, in the rectifier 132y of the first comparative example, when a noise is applied, the drain current IdH is easy to become a through-current that is a negative great current. In contrast, the rectifier 132 of the first embodiment provides an effect of keeping the OFF-state and being hard for the through-current to flow through, even when a noise is applied.

At a time t63, when the voltage Vu becomes higher than 0V, the rectification MOSFET 101ul of the low-side rectifier 132ul is turned off, and the synchronous rectification is finished. Then, a current flows in the built-in diode 102ul to increase the ON-voltage, and the rectification MOSFET 101ul is turned on, again the synchronous rectification is started. Thus, the rectification MOSFET 101ul repeats the on and off until the voltage Vu becomes sufficiently large.

The operation at the high-side during a time t64 to t65 is the same as that of the low-side during the time t60 to t63.

Hereinafter, a description is made on a modification of the determination circuit 103 of the rectifier 132 in FIG. 7 and FIG. 8.

Figure 7A:
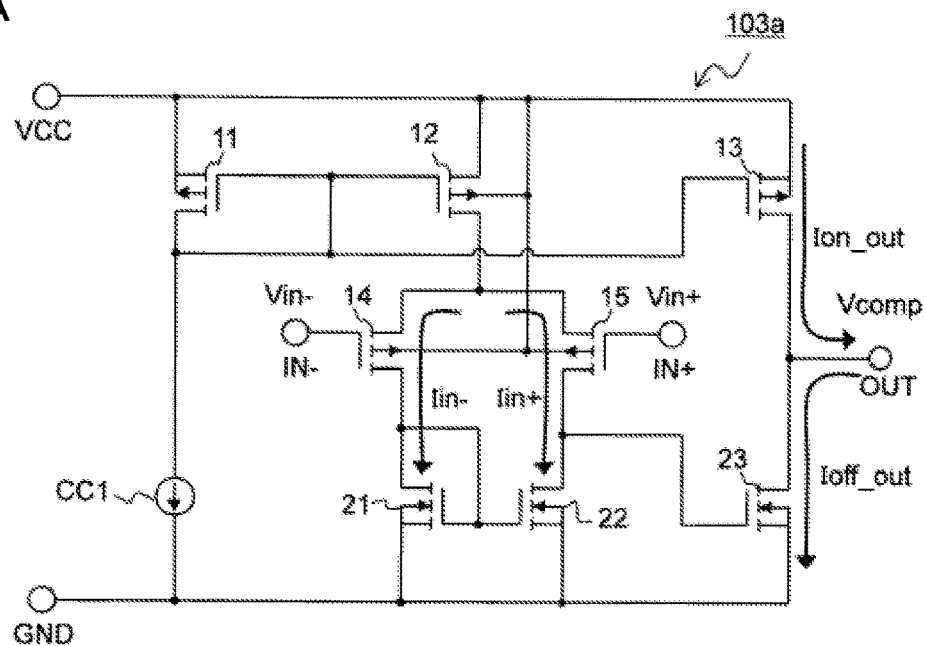
FIGS. 7A and 7B are circuit diagrams showing modifications A and B of a determination circuit of the rectifier of the first embodiment.
Figure 7B:
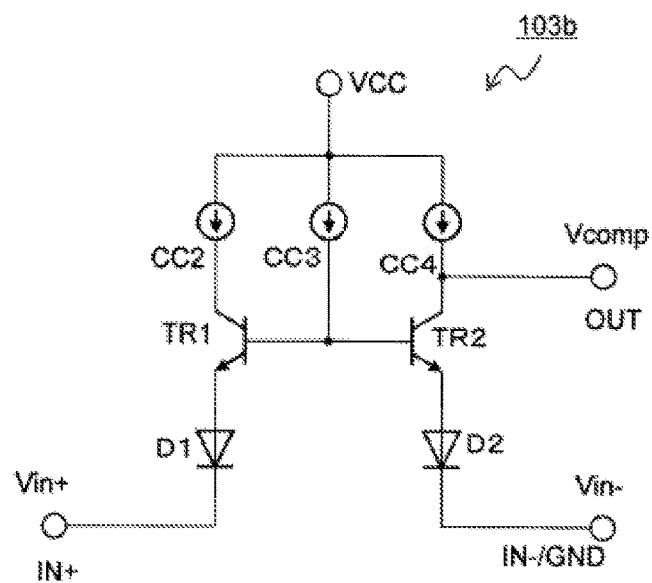

FIGS. 7A and 7B are circuit diagrams showing modification examples A and B of the determination circuit 103 of the rectifier 132 of the first embodiment.

A configuration of the determination circuit 103a shown in FIG. 7A is described. The determination circuit 103a is a comparator composed of MOSFET and the like. The determination circuit 103a is provided with a constant-current circuit CC1, PMOSes 11, 12, 13, 14, and 15, and NMOSes 21, 22, and 23. The determination circuit 103a is supplied with power to operate between its supply voltage terminal VCC and its ground terminal GND. The determination circuit 103a compares the voltage Vin+ of the non-inverted input terminal IN+ and the voltage Vin− of the inverted input terminal IN− to determine the on/off-state of the MOSFET.

The PMOS 11, 12, and 13 constitute a mirror circuit. That is, the drains of the PMOS 11, 12, and 13 are connected to the power supply voltage terminal VCC. The gates of PMOS 11, 12, and 13 and the source of the PMOS 11 are connected with each other and connected to the constant-current circuit CC1. The constant-current circuit CC1 is connected so that a current flows toward the ground terminal GND from the connected nodes: the gate of PMOS 11, 12, and 13 and the source of the PMOS 11.

Drains of PMOS 14 and 15 are connected to the source of the PMOS 12. The back gates of PMOS 12, 14, and 15 are connected to the power supply voltage terminal VCC. A gate of PMOS 14 is connected with the inverted input terminal IN−. A gate of PMOS 15 is connected with the non-inverted input terminal IN+. The source of the PMOS 14 is connected to a source of NMOS 21 and the gate of NMOS 21 and 22. The source of PMOS 15 is connected to a source of NMOS 22 and a gate of the NMOS 23. Drains of NMOS 21, 22, 23 are connected to the ground terminal GND.

The source of PMOS 13 and the source of NMOS 23 are connected to the output terminal OUT.

The operation of the determination circuit 103a shown in FIG. 7A is described. The constant-current circuit CC1 determines a current through the PMOS 11. The mirror circuit made by PMOS 11, 12, and 13 makes a current flow into the PMOS 12 and 13, which current flows in accordance with the ratio of the channel widths of the PMOS 12 and 13 versus PMOS 11. The current flowing through the PMOS 12 is shunted to a current Iin+ flowing to PMOS 15 and a current Iin− flowing to PMOS 14.

When the voltage Vin+ at the non-inverted input terminal IN+ of the determination circuit 103a is lower than the voltage Vin− at its inverted input terminal IN−, the current flowing through the PMOS 14 shunted from the current flowing in the PMOS 12 is smaller than that in the PMOS 15, and the current flowing through the NMOS 21 is also so reduced to turned off the NMOS 21. The NMOS 22 applied with the same gate voltage as the NMOS 21 is also turned off, and the gate voltage at NMOS 23 becomes so high to turn on the NMOS 23. As a result, a current Ioff_out flows from the output terminal OUT to the ground terminal GND, and the output terminal OUT outputs L level of voltage applied to the ground terminal GND.

When the voltage Vin+ at the non-inverted input terminal IN+ of the determination circuit 103a is higher than the voltage Vin− at its inverted input terminal IN−, the current flowing through the PMOS 14 shunted from the current flowing in the PMOS 12 is larger than that in the PMOS 15, and the current flowing through the PMOS 14 flows to the NMOS 21 to turn on the NMOS 21. The NMOS 22 applied with the same gate voltage as the NMOS 21 is also turned on, and the gate voltage at NMOS 23 becomes so low to turn off the NMOS 23. As a result, a current Ion_out flows from the power supply voltage terminal VCC to the output terminal OUT, and the output terminal OUT outputs H level of voltage applied to the power supply voltage terminal VCC.

Next, a description is made on characteristics of the determination circuit 103a shown in FIG. 7A.

In the alternator 140, the voltage at the battery 111 fluctuates, which is accompanied by a fluctuation of the voltage of the capacitor 107 that is a power source of the determination circuit 103a. As shown in FIG. 7A, operating the determination circuit 103a using the constant-current circuit CC1 avoids the operation of the determination circuit 103a from being influenced even if the voltage of the battery 111 fluctuates and the voltage of the capacitor 107 fluctuates. The constant-current circuit CC1 is configured using, for example, an N-type depletion MOSFET whose gate and source are shorted. The simple configuration of the constant-current circuit CC1 including the N-type depletion MOSFETs can reduce the area of the determination circuit 103a. As a result, the mounting area is reduced and the cost of the rectifier 132 is also reduced. The constant-current circuit CC1 may reduce the temperature dependency of a current. The N-type depletion MOSFET used for the constant-current circuit CC1 can be a suitable type of the N-type depletion MOSFET having a threshold voltage that may reduce the temperature dependency of the current of the constant-current circuit CC1. The alternator 140 is required to include the rectifier that can operate at a high temperature in order to withstand a heat generation. The use of the constant-current circuit CC1 whose temperature dependency is small allows a configuration in which the determination circuit 103 may perform a stable operation of determination in a wide temperature range required when used in the alternator 140. A current value of the constant-current circuit CC1 is made small in a range which causes no problem with the noise immunity. This enables reducing the capacitance of the capacitor 107, the mounting area, and the cost of the rectifier 132.

The determination circuit 103a may be a circuit including MOSFETs rather than bipolar transistors, and thereby, the current consumption of the comparators can be reduced, resulting in the reduction of the capacitance of the capacitor 107, the mounting area, and the cost of the rectifier 132.

A description is made on a configuration of the determination circuit 103b shown in FIG. 7B.

The determination circuit 103b is a differential amplification circuit configured to include constant-current circuits CC2 to CC4, N-type bipolar transistors TR1 and TR2, diodes D1 and D2, and performs the ON/OFF determination of the rectification MOSFET 101.

The constant-current circuit CC2 is connected in a direction from the power supply voltage terminal VCC toward a collector of the N-type bipolar transistor TR1 with them. The constant-current circuit CC3 is connected in a direction from the power supply voltage terminal VCC toward connection nodes to bases of the N-type bipolar transistors TR1 and TR2 with them.

The constant-current circuit CC4 is connected in a direction from the power supply voltage terminal VCC toward the collector of the N-type bipolar transistor TR2 with them. The collector of the N-type bipolar transistor TR2 is connected to the output terminal OUT. The constant-current circuits CC2 to CC4 determine the amount of the current flowing through the determination circuit 103b.

The diode D1 is connected in a direction from an emitter of the N-type bipolar transistor TR1 toward the non-inverted input terminal IN+ with them. The diode D2 is connected in a direction from an emitter of the N-type bipolar transistor TR2 toward the inverted input terminal IN– and the ground terminal GND with them.

The operation of the determination circuit 103b shown in FIG. 7B is described. When the voltage Vin+ at the non-inverted input terminal IN+ of the determination circuit 103b becomes lower than the voltage Vin– at the inverted input terminal IN–, the current flowing through the constant-current circuit CC3 flows to the base of the N-type bipolar transistor TR1, but does not flow to the base of the N-type bipolar transistor TR2. As a result, the N-type bipolar transistor TR1 is turned on, the N-type bipolar transistor TR2 is turned off, and the voltage of H level applied to the power supply voltage terminal VCC is outputted through the output terminal OUT. The current flowing through the constant-current circuit CC2 flows from the collector of the N-type bipolar transistor TR1 to its emitter, and passes through the diode D1 to exit to the non-inverted input terminal IN+. The current flowing through the constant-current circuit CC4 exits to the output terminal OUT.

Conversely, when the voltage Vin+ at the non-inverted input terminal IN+ of the determination circuit 103 becomes higher than the voltage Vin– at the inverted input terminal IN–, the current flowing through the constant-current circuit CC3 flows to the base of the N-type bipolar transistor TR2, but does not flow to the base of the N-type bipolar transistor TR1. As a result, the N-type bipolar transistor TR1 is turned off, the N-type bipolar transistor TR2 is turned on, and the L level voltage of the ground terminal GND is outputted through the output terminal OUT. No current flows through the constant-current circuit CC2, the current flowing through the constant-current circuit CC4 flows from the collector of the N-type bipolar transistor TR2 to its emitter and exits to the inverted input terminal IN– through the diode D2.

Characteristics of the determination circuit 103b shown in FIG. 7B is described.

The determination circuit 103b performs the ON/OFF determination by changing the path of the current flow, and thus is less susceptible to a malfunction due to noise.

Further, the determination circuit 103b has a symmetrical configuration of the path of the current flow from the power supply voltage terminal VCC to the non-inverted input terminal IN+ and the path of the current flow from the power supply voltage terminal VCC to the inverted input terminal IN–, and thus the temperature dependency of each path can be cancelled to reduce the temperature dependence of the entire circuit.

Furthermore, the determination circuit 103b is not affected by a voltage fluctuation of the capacitor 107 due to a voltage fluctuation of the battery 111 by using the constant-current circuits CC2 to CC4. That is, the determination circuit 103b may reduce the dependency of the battery voltage. The constant-current circuits CC2 to CC4 is configured by using, for example, the N-type depletion MOSFET whose gate and source are shorted, similarly to the constant-current circuit CC1 in FIG. 7A.

However, the determination circuit 103b of FIG. 7B uses the N-type bipolar transistors TR1 and TR2 rather than the MOSFET used by the comparator in FIG. 7A. Driving the N-type bipolar transistors TR1 and TR2 requires a predetermined current and may cause a large amount of the current consumption.

Figure 8C:
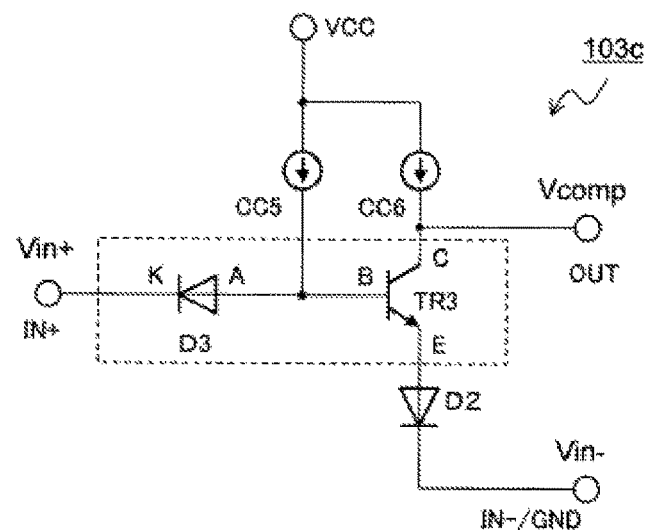
FIGS. 8C and 8D are circuit diagrams showing modifications C and D of the determination circuit of the rectifier of the first embodiment.
Figure 8D:
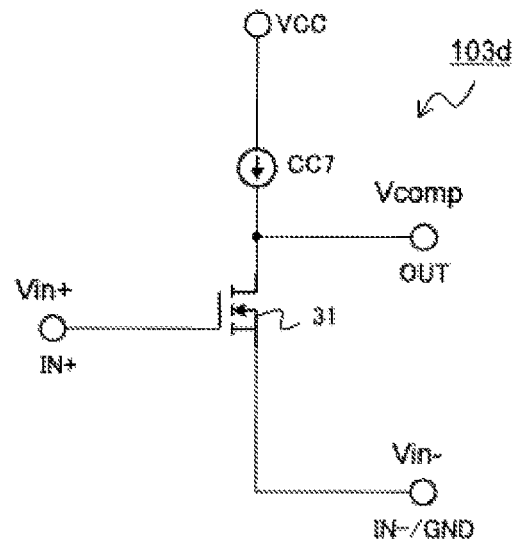

FIGS. 8C and 8D are circuit diagrams showing modification examples of the determination circuit 103 of the rectifier 132 of the first embodiment A description is made on a configuration of a determination circuit 103c shown in FIG. 8C. The circuit shown in FIG. 8C is a determination circuit 103c using an N-type bipolar transistor TR3.

The determination circuit 103c is a circuit configured to include constant-current circuits CC5 and CC6, the N-type bipolar transistor TR3, and diodes D2 and D3, and performs the ON/OFF determination of the rectification MOSFET 101.

The constant-current circuit CC5 is connected to the power supply voltage terminal VCC and a connection node between the base B of the N-type bipolar transistor TR3 and the anode A of the diode D3 in a direction from the terminal VCC to the connection node.

The constant-current circuit CC6 is connected to the power supply voltage terminal VCC and the collector C of the N-type bipolar transistor TR3 in a direction from the terminal VCC to the collector C, which collector C is connected to the output terminal OUT. The constant-current circuits CC5 and CC6 determine an amount of the current flowing through the determination circuit 103c.

The diode D3 is connected to the base B of the N-type bipolar transistor TR3 and the non-inverted input terminal IN+ in a direction from the base B to the terminal IN+. The diode D2 is connected to the emitter E of the N-type bipolar transistor TR2 and the inverted input terminal IN– and the ground terminal GND in a direction from the emitter E toward the terminal IN– and the terminal GND.

A description is made on an operation of the determination circuit 103c shown in FIG. 8C.

When the voltage Vin+ at the non-inverted input terminal IN+ of the determination circuit 103c becomes lower than the voltage Vin– at the inverted input terminal IN–, the current flowing through the constant-current circuit CC5 does not flow to the base B of the N-type bipolar transistor TR3, but flows through the diode D3 to the non-inverted input terminal IN+ as a forward current of the diode D3. As a result, the N-type bipolar transistor TR3 is turned off, and the voltage of H level applied to the power supply voltage terminal VCC is outputted through the output terminal OUT. The current flowing through the constant-current circuit CC6 flows to the output terminal OUT. In the rectifier 132 in FIG. 2, the rectification MOSFET 101 has its gate applied with the L level voltage to be turned off (first state).

Conversely, when the voltage Vin+ at the non-inverted input terminal IN+ of the determination circuit 103c becomes higher than the voltage Vin− at the inverted input terminal IN−, the current flowing through the constant-current circuit CC5 flows to the base B of the N-type bipolar transistor TR3, but does not flow to the diode D3. As a result, the N-type bipolar transistor TR3 is turned on, and the L level voltage of the ground terminal GND is outputted through the output terminal OUT. The current flowing through the constant-current circuit CC5 flows from the collector C of the N-type bipolar transistor TR3 to its emitter E, and flows through the diode D3 as a forward current to the inverted input terminal IN−. In the rectifier 132 in FIG. 2, the rectification MOSFET 101 has its gate applied with the H level voltage to be turned on (second state).

Note that if the non-inverted input terminal IN+ and the inverted input terminal IN− of the determination circuit 103c are connected in reverse to the FIG. 2, the first state and the second state becomes reversed with ON and OFF.

Characteristics of the determination circuit 103c shown in FIG. 8C is described.

The determination circuit 103c in FIG. 8C performs the ON/OFF determination by changing the path of the current flow like the determination circuit 103b shown in FIG. 7B, and thus is less susceptible to a malfunction due to noise.

In the first path from the power supply voltage terminal VCC to the inverted input terminal IN− (ground terminal GND), the current flows from the P-type semiconductor region of the base B of the N-type bipolar transistor TR3 to the high-concentration N-type semiconductor region of its emitter E. In the second path from the power supply voltage terminal VCC to the non-inverted input terminal IN+, the current flows from the P-type semiconductor region of the anode A of the diode D3 to the high-concentration N-type semiconductor region of its cathode K. In both of the paths the current flows from the P-type semiconductor region to the high-concentration N-type semiconductor region. These semiconductor areas are described in detail with reference to FIG. 9.

The determination circuit 103c has a configuration in which the diode D3 is configured in the same way as the base B-emitter E of the N-type bipolar transistor TR3. This enables the first path and the second path to have the same temperature dependency. In the determination circuit 103c, similarly to the determination circuit 103b of FIG. 7B, the temperature dependency of respective elements constituting the first path and the second path can be cancelled to reduce the temperature dependency of the entire circuit.

Furthermore, the determination circuit 103c is not affected by the voltage fluctuation of the capacitor 107 due to the voltage fluctuation of the battery 111 by using the constant-current circuits CC5 to CC6. That is, the determination circuit 103c may reduce the dependency of the battery voltage. The constant-current circuits CC5 and CC6 are configured by using, for example, the N-type depletion MOSFET whose gate and source are shorted, similarly to the constant-current circuit CC1 in FIG. 7A.

The determination circuit 103c of FIG. 8C can reduce the current consumption by an amount of the current flowing from the collector of the N-type bipolar transistor TR1 to its emitter through the constant-current circuit CC2 in the determination circuit 103b shown in FIG. 7B. As a result, the determination circuit 103c of FIG. 8C enables a reduction of the capacitance of the capacitor 107, the mounting area, and the cost of the rectifier 132.

A description is made on a configuration of a determination circuit 103d shown in FIG. 8D. The determination circuit 103d shown in FIG. 8D uses an N-type MOSFET 31.

The determination circuit 103d is configured to include a constant-current circuit CC7 and the N-type MOSFET 31. The constant-current circuit CC7 is connected in a direction from the power supply voltage terminal VCC to a drain of the N-type MOSFET 31 with them. The drain of the N-type MOSFET 31 is connected to the output terminal OUT. The gate of the N-type MOSFET 31 is connected to the non-inverted input terminal IN+. The source of the N-type MOSFET 31 is connected to the inverted input terminal IN− and the ground terminal GND. The constant-current circuits CC7 determines the current flowing through the determination circuit 103d.

A description is made on an operation of the determination circuit 103d shown in FIG. 8D.

When the voltage Vin+ at the non-inverted input terminal IN+ of the determination circuit 103d becomes lower than the sum of the voltage Vin− at the inverted input terminal IN− and the threshold voltage of the N-type MOSFET 31, the N-type MOSFET 31 is turned off. When the N-type MOSFET 31 is turned off, the voltage of H level applied to the power supply voltage terminal VCC is outputted through the output terminal OUT. The current flowing through the constant-current circuit CC7 flows to the output terminal OUT.

Conversely, when the voltage Vin+ at the non-inverted input terminal IN+ of the determination circuit 103 becomes higher than the sum of the voltage Vin− at the inverted input terminal IN− and the threshold voltage of the N-type MOSFET 31, the N-type MOSFET 31 is turned on. When the N-type MOSFET 31 is turned on, the voltage of L level at the ground terminal GND is outputted through the output terminal OUT. The current flowing through the constant-current circuit CC7 flows through the N-type MOSFET 31 to the inverted input terminal IN−.

Characteristics of the determination circuit 103d shown in FIG. 8D is described.

The determination circuit 103d in FIG. 8D is configured to include only one N-type MOSFET 31, and thus its circuit is simple and its current consumption is also small. The simple circuit enables an area of the control IC 108, the mounting area, and the cost of the rectifier 132 to be reduced. The small current consumption enables the capacitance of the capacitor 107, the mounting area, and the cost of the rectifier 132 to be reduced.

Figure 9A:
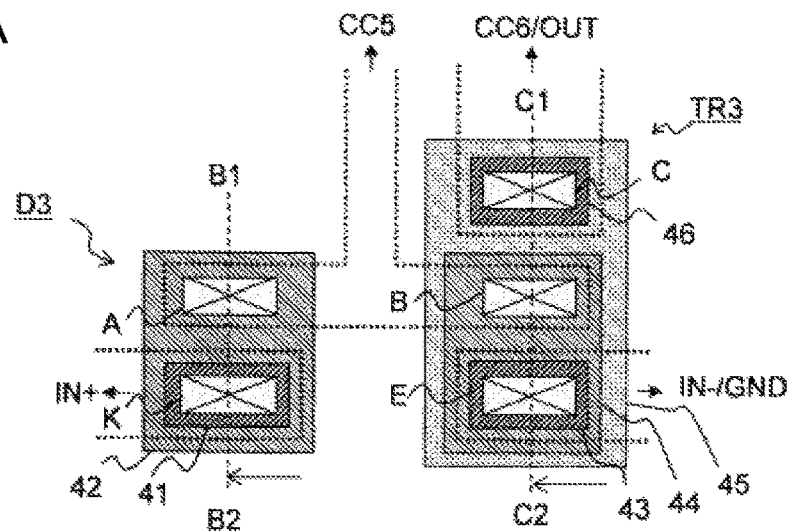
FIGS. 9A to 9C are layout diagrams of a determination circuit of the modification C of the rectifier (C) in the first embodiment.
Figure 9B:
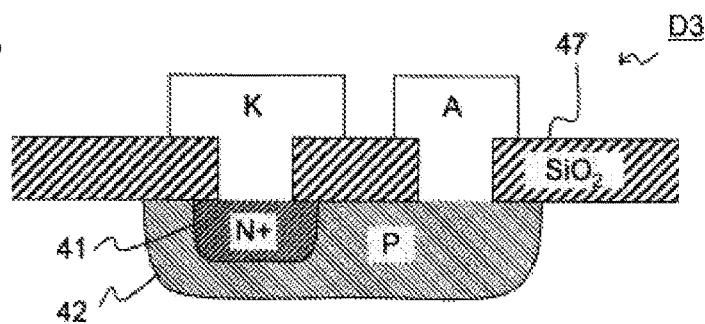
Figure 9C:
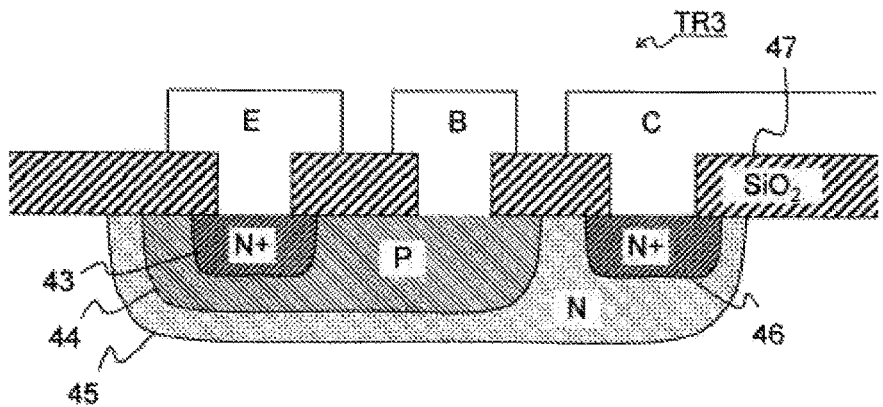

FIGS. 9A to 9C are layout diagrams of the determination circuit 103c that is a modification example (c) of the rectifier 132 in the first embodiment.

Among the respective layouts shown in FIGS. 9A to 9C, the darkest hatched parts are the high-concentration N-type silicon regions 41 and 46. The thinnest hatched part is the N-type silicon region 45. The hatched parts with medium darkness are the P-type silicon regions 42 and 44. Rectangular parts having diagonal lines, indicate electrodes (conductors) piercing through an insulation layer. Dashed lines indicate conductors configured on an insulation layer (not illustrated).

FIG. 9A shows a plan view of the layout.

On the left side of the FIG. 9A is formed the diode D3. The cathode K of the diode D3 is surrounded by the high-concentration N-type silicon region 41. The high-concentration N-type silicon region 41 is, further, surrounded by the P-type silicon region 42. The P-type silicon region 42 further encloses the anode A of the diode D3. The cathode K of the diode D3 is covered by the conductor to be connected to the non-inverted input terminal IN+ (not shown).

On the right side of FIG. 9A is formed the N-type bipolar transistor TR3. The emitter E of the N-type bipolar transistor TR3 is surrounded by the high-concentration N-type silicon region 43, and further surrounded by the P-type silicon region 44. The P-type silicon region 44 further encloses the base B of the N-type bipolar transistor TR3. The collector C of the N-type bipolar transistor TR3 is surrounded by the high-concentration N-type silicon region 46. The high-concentration N-type silicon region 46 and the P-type silicon region 44 are surrounded by the N-type silicon region 45. The anode A and cathode K of the diode D3 are laid out in a symmetrical way to and configured in the same way as the base B and the emitter E of the N-type bipolar transistor TR3.

The anode A of the diode D3 and the base B of the N-type bipolar transistor TR3 are covered with the conductor and electrically connected with each other, and further electrically connected to the constant-current circuit CC5 (not shown).

The collector C of the N-type bipolar transistor TR3 is covered with the conductor and electrically connected to the constant-current circuit CC6 and the output terminal OUT (not shown).

FIG. 9B shows a cross-sectional view taken along B1-B2 cross section of the diode D3.

The cathode K is an electrode which penetrates the silicon oxide film 47 and contacts the high-concentration N-type silicon region 41. The high-concentration N-type silicon region 41 is formed under the silicon oxide film 47. On the lower side of the high-concentration N-type silicon region 41 is formed the P-type silicon region 42. The anode A of the diode D3 is an electrode which penetrates the silicon oxide film 47 and contacts the P-type silicon region 42.

FIG. 9C shows a cross-sectional view taken along C1-C2 cross-section of the N-type bipolar transistor TR3.

The emitter E of the N-type bipolar transistor TR3 is an electrode which penetrates the silicon oxide film 47 and contacts the high-concentration N-type silicon region 43. The high-concentration N-type silicon region 43 is formed under the silicon oxide film 47. On the lower side of the high-concentration N-type silicon region 43 is formed the P-type silicon region 44. On the lower side of the P-type silicon region 44 is formed the N-type silicon region 45.

The base B of the N-type bipolar transistor TR3 is an electrode which penetrates the silicon oxide film 47 and contacts the P-type silicon region 44.

The collector C of the N-type bipolar transistor TR3 is in contact with the high-concentration N-type silicon region 46. The high-concentration N-type silicon region 46 is formed under the silicon oxide film 47. Under the high-concentration N-type silicon region 46 is formed the N-type silicon region 45.

The cross section of the anode A and the cathode K of the diode D3 is configured to be symmetrical to the cross section of the base B and emitter E of the N-type bipolar transistor TR3. This cancels each of the temperature dependencies of the respective elements with each other, which enables a reduction of the temperature dependency of the operation of the determination circuit 103c.

Figure 10:
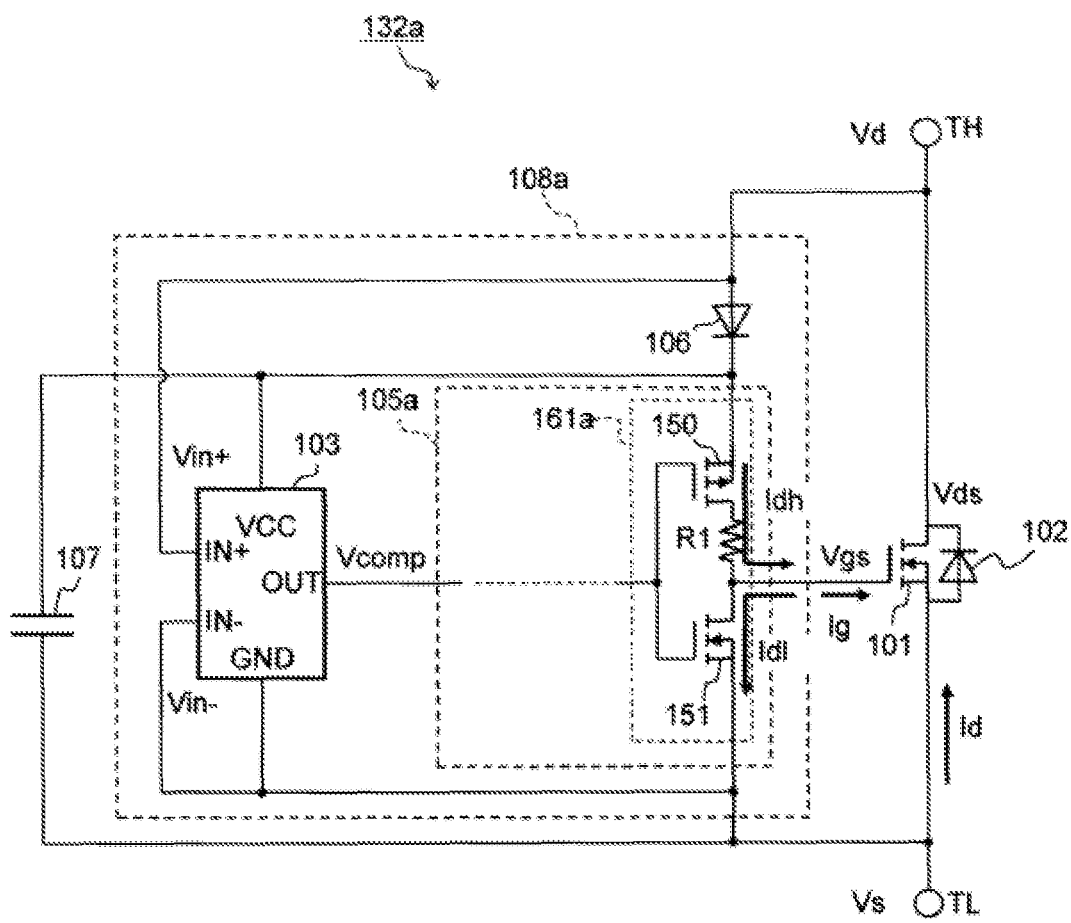
FIG. 10 is a circuit diagram showing a rectifier of an autonomous type synchronous rectification MOSFET of a second embodiment.

FIG. 10 is a circuit diagram showing a rectifier 132a of the autonomous type synchronous rectification MOSFET of the second embodiment.

The rectifier 132a of the second embodiment shown in FIG. 10 has a control IC 108a different from the rectifier 132 of the first embodiment shown in FIG. 2. Further, the control IC 108a of the second embodiment has a gate drive circuit 105a different from that of the control IC 108 in the first embodiment.

The gate drive circuit 105a of the second embodiment has a CMOS buffer 161a of the final stage different from the gate drive circuit 105 of the first embodiment. The CMOS buffer 161a has a resistor R1 connected to the high-side P-type MOSFET 150 in series and on the path of the drain current Idh for turning on the gate of the rectification MOSFET 101. The resistor R1 may be connected with either the source or the drain of the high-side P-type MOSFET 150. The resistor R1 of the second embodiment is disposed in place of the constant-current circuit 156 of the first embodiment.

When turning on the rectification MOSFET 101, the gate current Ig flows from the high-side P-type MOSFET 150 to the resistor R1. This gate current Ig is limited by the resistor R1.

When turning off the rectification MOSFET 101, the gate current Ig of the rectification MOSFET 101 flows to the low-side N-type MOSFET 151. This gate current Ig is not limited by the resistor R1.

The rectifier 132a of the second embodiment, similarly to the rectifier 132 of the first embodiment (see FIG. 2), limits the gate current Ig when turning on the rectification MOSFET 101 to slow down the speed of the turn on, and does not limit the gate current Ig when turning off the rectification MOSFET 101 to increase the OFF speed. This enables preventing a chattering and a through-current due to a noise applied. As the rectifier 132 of the first embodiment (see FIG. 2), as compared with the case of using the constant-current circuit 156, it is possible to limit the gate current Ig during the ON-state by a simpler circuit.

Figure 11:
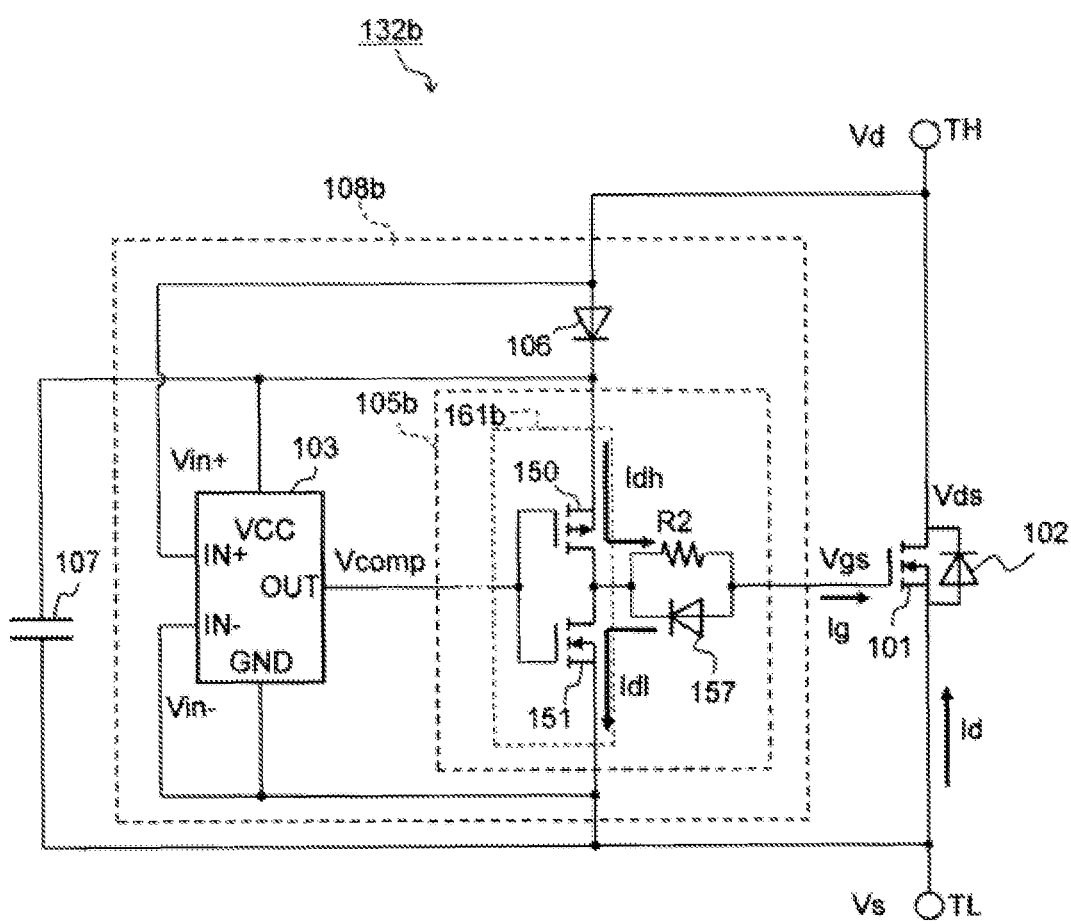
FIG. 11 is a circuit diagram showing a rectifier of an autonomous type synchronous rectification MOSFET of a third embodiment.

FIG. 11 is a circuit diagram showing a rectifier 132b of the autonomous type synchronous rectification MOSFET according to the third embodiment.

The rectifier 132b of the third embodiment shown in FIG. 11 has a control IC 108b different from the rectifier 132 of the first embodiment shown in FIG. 2. The control IC 108b of the third embodiment, further, has a gate drive circuit 105b different from that of the control IC 108 in the first embodiment.

The gate drive circuit 105b of the third embodiment has a resistor R2 and a diode 157 connected in parallel between the output of the CMOS buffer 161b at the final stage and the gate of the rectification MOSFET 101.

When turning on the rectification MOSFET 101, the gate current Ig flows from the high-side P-type MOSFET 150 through the resistor R2 to the gate of the rectification MOSFET 101. This gate current Ig is limited by the resistor R2.

When turning off the rectification MOSFET 101, the gate current Ig flows through the diode 157 in the opposite direction of passing through the diode 157 to the low-side N-type MOSFET 151 and is not limited by the resistor R2.

The rectifier 132b of the third embodiment, similarly to the rectifier 132 of the first embodiment (see FIG. 2), limits the gate current Ig when turning on the rectification MOSFET 101 to decrease the turn-on speed; does not limit the gate current Ig when turning off the rectification MOSFET 101 to increase the turn-off speed. This enables preventing the chattering and the through-current when a noise is applied. Compared with the case of using the constant-current circuit 156 like the rectifier 132 of the first embodiment (see FIG. 2), the third embodiment has a large effect from the variation of the elements and a large temperature-dependency, but enables a simpler circuit to limit the gate current Ig during the ON-state.

Figure 12:
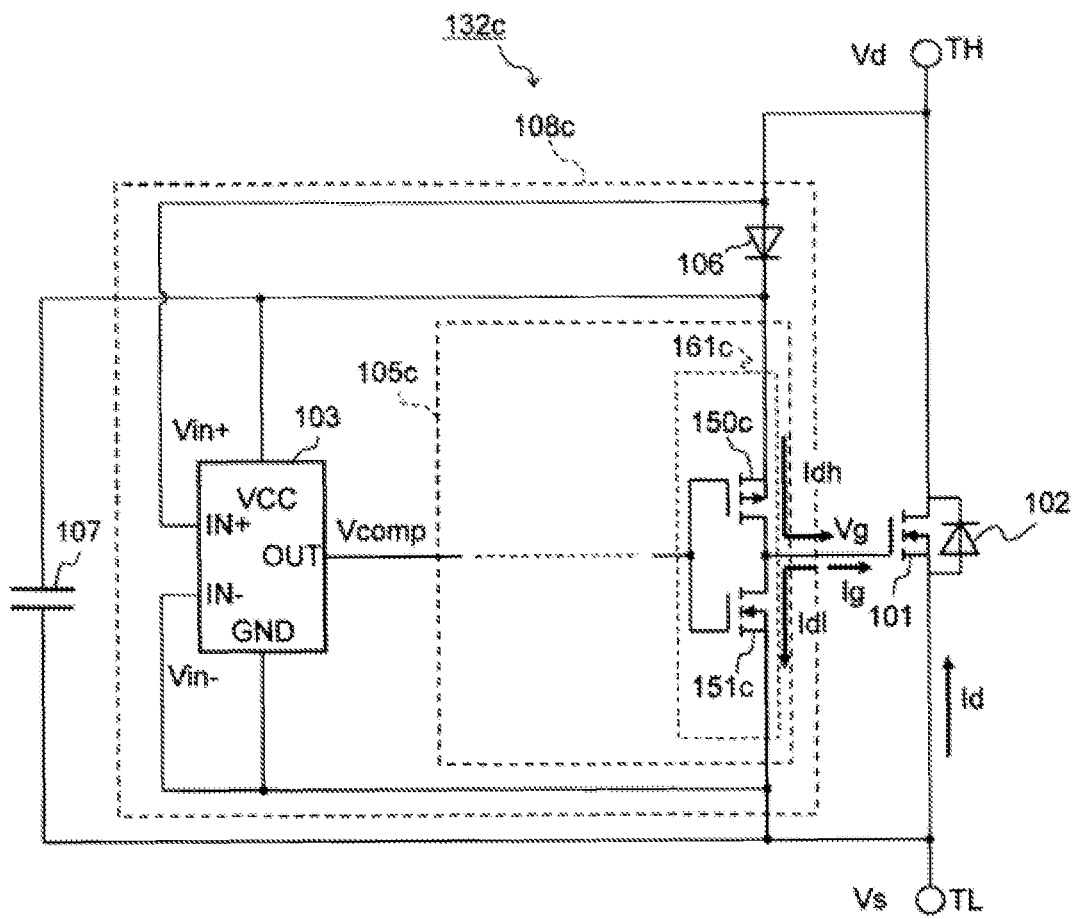
FIG. 12 is a circuit diagram showing a rectifier of autonomous type synchronous rectification MOSFET of a fourth embodiment.

FIG. 12 is a circuit diagram showing a rectifier 132c of the autonomous type synchronous rectification MOSFET in the fourth embodiment.

The rectifier 132c of the fourth embodiment shown in FIG. 12 has a control IC 108c different from the rectifier 132 of the first embodiment shown in FIG. 2. Further, the control IC 108c of the fourth embodiment has a gate drive circuit 105c different from the control IC 108 in the first embodiment.

The gate drive circuit 105c is configured to include CMOS buffers of one or more stages. Here is illustrated a CMOS buffer 161c at the final stage.

The CMOS buffer 161c at the final stage is configured to include a circuit serially connecting the high-side P-type MOSFET 150c and the low-side N-type MOSFET 151c.

The high-side P-type MOSFET 150c of the fourth embodiment, has either small channel width W_h or a large channel length L_h, as compared to the high-side P-type MOSFET 150 of the first embodiment. Thereby, the rectification MOSFET 101 is able to suppress the gate current Ig when turning-on the rectification MOSFET 101 to slow down the turn-on speed. Generally, the channel length L_h is determined in the process of manufacturing of the chip, it is preferable to reduce the channel width W_h.

That is, the CMOS buffer 161c at the final stage should have the channel width W_h of the high-side P-type MOSFET 150c designed to satisfy the following equation (1), when representing the channel width and length of the high-side P-type channel MOSFET 150c respectively with "W_h" and "L_h", and the channel width and length of the low-side N-type MOSFET 151c respectively with W_l and L_l.

[Math 1]

$$\frac{W\_h}{L\_h} < \frac{2 \times W\_l}{L\_l} \quad (1)$$

The rectifier 132c of the fourth embodiment, similarly to the rectifier 132 of the first embodiment shown in FIG. 2, may reduce the gate current Ig when turning on the rectification MOSFET 101 and slow down the ON speed. In addition, the rectifier 132c of the fourth embodiment may increase the gate current Ig when turning off the rectification MOSFET 101 and speed up the turning OFF. This enables further preventing the chattering and the through-current when a noise is applied.

The rectifier 132c of the fourth embodiment, as compared with the first to third embodiments, needs no constant-current circuit 156, resistor, or diode, and may reduce the gate current Ig when turning on using a simpler circuit.

The rectifier may in the wide range of temperature and operating frequency required for the alternator 140 by sufficiently shortening a time from when the determination circuit 103 in the control IC 108c outputs the on-off determination result until the rectification MOSFET 101 is turned on or off, that is, sufficiently shortening a delay time from an input to the gate drive circuit 105c until an output therefrom.

The delay time of the gate drive circuit 105c is determined by the drive time of the MOSFET constituting a part of the gate drive circuit 105c and has a temperature dependency that the delay time becomes longer as the temperature rises. When the delay time of the gate drive circuit 105c is long, the timing of the ON-OFF switching of the rectification MOSFET 101 changes according to the temperature. Additionally, when the delay time of the gate drive circuit 105c is long, if the operating frequency changes and the operating period changes, the on-off timing of the rectification MOSFET 101 differs from before and is changed by the operating frequency.

However, even if the on-off timing of the rectification MOSFET 101 is changed depending on the temperature and operating frequency, only the period of the rectified current flowing through the built-in diode 102 changes and the power loss is only slightly changed, and thus no major problems occur.

The chattering is more unlikely to occur as the timing of the rectification MOSFET 101 turning on is delayed. On the other hand, if the timing of the rectification MOSFET 101 turning off is too much delayed, a large reverse current flows; and if the timing of turning off the rectification MOSFET 101 is too early, such a large current flows in the built-in diode 102 that the ON-voltage of the rectification MOSFET 101 becomes too large to prevent easy occurrence of the chattering.

Accordingly, it is important to reduce the dependency on the temperature and the operating frequency of the timing for turning off the rectification MOSFET 101. For this purpose, it is sufficient to reduce the delay of the gate drive circuit 105 for turning off the rectification MOSFET 101.

In the rectifier 132c of the fourth embodiment, the input capacitance of the CMOS buffer 161c at the final stage becomes so small that the delay of CMOS buffer 161c at the final stage becomes smaller and that the delay time when the input turns off becomes small, by reducing the channel width W_h of the high-side P-type MOSFET 150c constituting a part of the CMOS buffer 161c at the final stage of the gate drive circuit 105c. Thus, the operation condition of the rectifier 132c of the fourth embodiment satisfies a wide range of temperatures and operating frequency required by the alternator 140.

Figure 13:
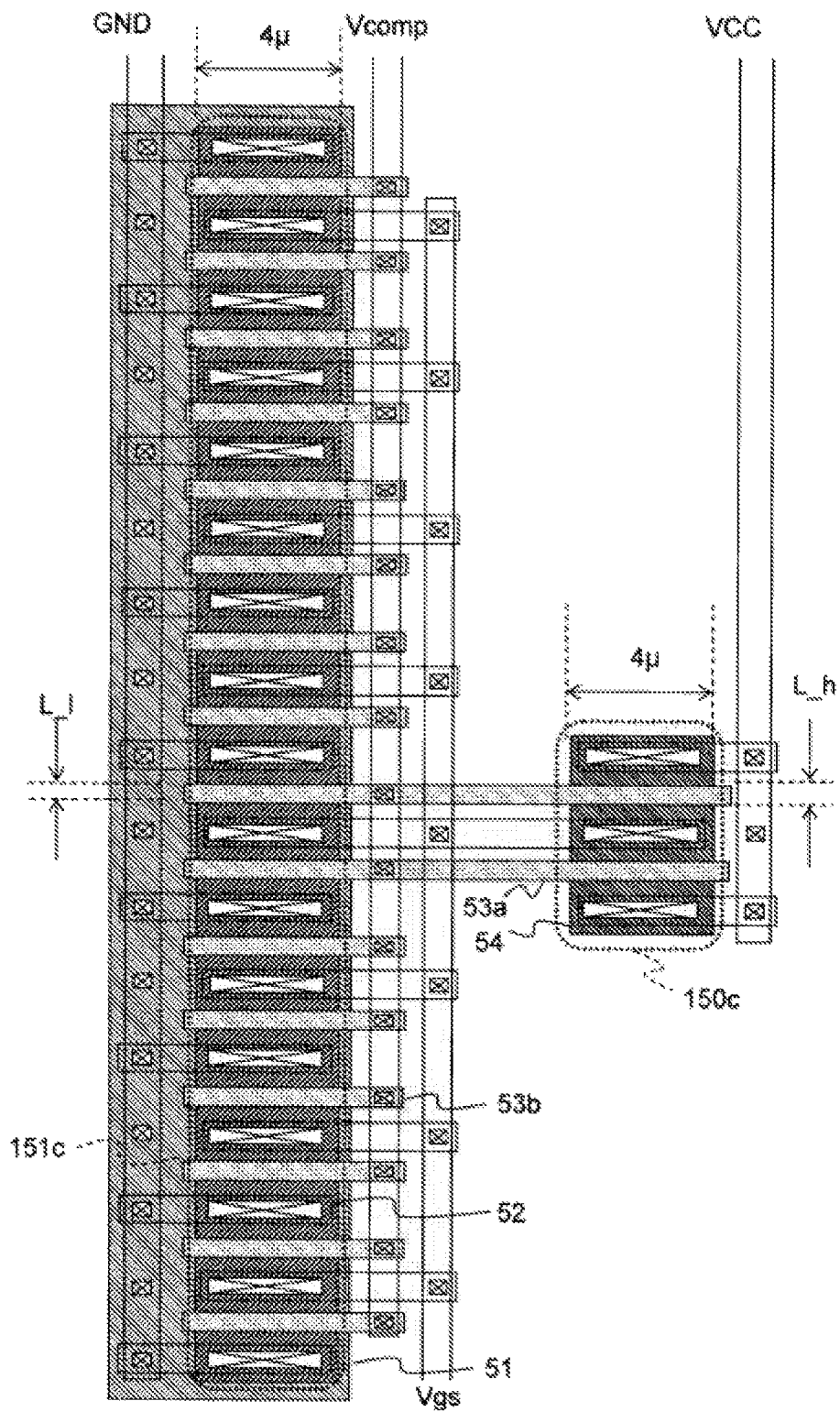
FIG. 13 is a layout diagram showing a channel length and a channel width of a gate drive circuit of the fourth embodiment.

FIG. 13 is a layout diagram showing a channel length and a channel width of the gate drive circuit 105c according to the fourth embodiment. Here is shown the layout of the CMOS buffer 161c at the final stage.

The high-side P-type MOSFET 150c and the low-side N-type MOSFET 151c constituting a part of the final stage CMOS buffer 161c of the gate drive circuit 105c (see FIG. 12) are configured so that a current flowing through the MOSFET driven when the rectification MOSFET 101 turns on is smaller than a current flowing through the MOSFET driven when the rectification MOSFET 101 turns off.

The high-side P-type MOSFET 150c has a channel formed by a polysilicon wiring 53a which is formed on the high-concentration P-type silicon region 54. The channel length L_h of the high-side P-type MOSFET 150c is the same length as the channel length L_l of low-side N-type MOSFET 151c. The channel width of the high-side P-type MOSFET 150c is 8 μm in total, since two channels of 4 μm width is formed. The low-side N-type MOSFET 151c has a channel formed by a polysilicon wiring 53b formed on the high-concentration N-type silicon region 52. The high-concentration N-type silicon region 52 is surrounded by a P-type well silicon region 51. The channel length L_l of the low-side N-type MOSFET 151c is the same length as the channel length L_h of the high-side P-type MOSFET 150c and, its channel width is 64 μm in total since 16 channels of 4 μm width are formed.

In other words, the channel width W_h of the high-side P-type MOSFET 150c of the final stage is 8 μm, and the channel width W_l of the low-side N-type MOSFET 151c is 64 μm.

The gate drive circuit 105c of the fourth embodiment may have the input capacitance (gate capacitance) of the CMOS buffer 161c of final stage smaller than that of the first embodiment by the above-described amount, and thus the delay of the gate drive circuit 105c when the rectification MOSFET 101 turns off at the time of OFF can be further reduced compared with the related art. This allows for reducing the dependency on the temperature and the frequency of the timing of turning off the rectification MOSFET 101. In addition, the circuit area can be reduced according to the decrease of the channel width of the high-side P-type MOSFET 150c at the final stage. The channel width of the high-side P-type MOSFET 150 at the final stage of the first embodiment is 128 um. Comparing it, the channel width of the high-side P-type MOSFET 150 at the final stage of the fourth embodiment is 8 um, which is significantly reduced.

FIG. 13 shows a layout in the case of forming a circuit on the n-type silicon substrate. When forming this on an SOI (Silicon On Insulator) substrate, the P-type MOSFET and the N-type MOSFET is formed on another island surrounded by a silicon oxide film. The SOI substrate allows preventing a malfunction due to a latch-up at a high temperature.

Figure 14:
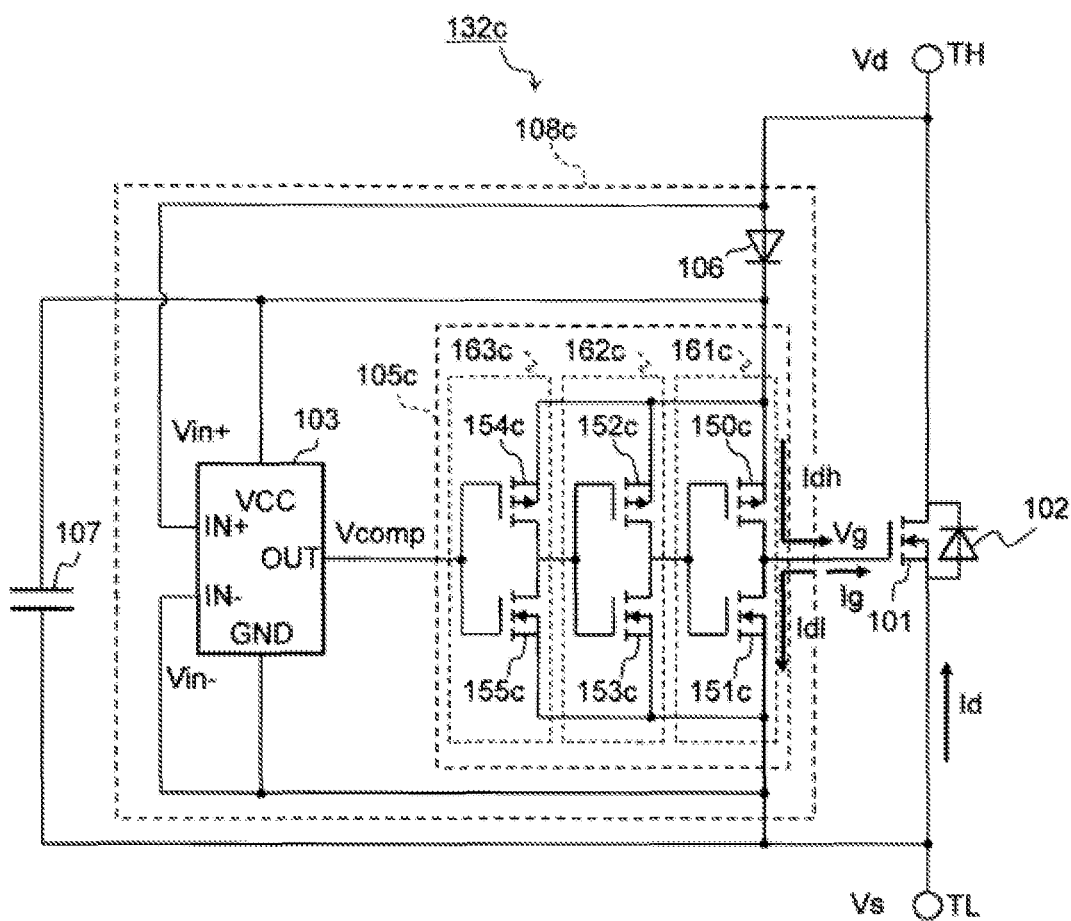
FIG. 14 is a circuit diagram showing a rectifier of autonomous type synchronous rectification MOSFET of a modification of a fourth embodiment.

FIG. 14 is a circuit diagram showing a rectifier of the autonomous type synchronous rectification MOSFET that is a modification of the fourth embodiment. The modification example of the fourth embodiment shows a circuit diagram in a case of configuring the gate drive circuit 105 with the three stages of CMOS buffers in the rectifier 132c of the autonomous type synchronous rectification MOSFET of the fourth embodiment shown in FIG. 12.

The rectifier 132c of the fourth embodiment shown in FIG. 14 has a control IC 108c different from the rectifier 132 of a modification of the first embodiment shown in FIG. 3. Furthermore, the control IC 108c of the fourth embodiment has a gate drive circuit 105c different from the control IC 108 in the first embodiment.

The gate drive circuit 105c is configured to include a CMOS buffer 161c at the final stage, the CMOS buffer 162c at the one stage before the final stage, and the CMOS buffer 163c at the two stages before the final stage.

When constituting the gate drive circuit 105c with a plurality of CMOS buffers 161c to 163c, in the high-side P-type MOSFET and the low-side N-type MOSFET constituting the single CMOS buffer, it is preferable that the current of the MOSFET driving the rectification MOSFET 101 to turn on the rectification MOSFET 101 is smaller than the current of the MOSFET driving the rectification MOSFET 101 to turn off the rectification MOSFET 101.

The CMOS buffer 161c at the final stage has the same configuration as that of FIG. 12, and the channel width W_h of the high-side P-type MOSFET 150c should be designed so as to satisfy the above equation (1).

The CMOS buffer 162c at one stage before the final stage is configured to include a circuit having the high-side P-type MOSFET 152c and a low-side N-type MOSFET 153c connected with each other in series.

The low-side N-type MOSFET 153c of the fourth embodiment shown in FIG. 14, as compared to low-side N-type MOSFET 153 of the first embodiment shown in FIG. 3, the channel width W_l2 is relatively small, or a channel length L_l2 is relatively large. This may delay the output of the CMOS buffer 162c at one stage before the final stage, resulting in the delay of turning on the rectification MOSFET 101. Generally, the channel length L_l2 is determined in the process of manufacturing a chip, and thus it is preferable to reduce the channel width W_l2.

In other words, when notating the channel width and the channel length of a high-side P-type MOSFET 152c and the low-side N-type MOSFET 153c of the CMOS buffer 162c at one stage before the final stage respectively as W_h2, L_h2, W_l2, and L_l2, the design of the channel width W_l2 needs to be conducted to satisfy the following equation (2):

[Math. 2]

$$\frac{W\_h2}{L\_h2} > \frac{2 \times W\_l2}{L\_l2} \tag{2}$$

The CMOS buffer 163c at two stage before the final stage is configured to include a circuit having a high-side P-type MOSFET 154c and a low-side N-type MOSFET 155c connected with each other in series.

The high-side P-type MOSFET 154c of the fourth embodiment shown in FIG. 14, as compared to high-side P-type MOSFET 154 of the first embodiment shown in FIG. 3, the channel width W_h3 is small, or a channel length L_h3 is large. This may delay the output of the CMOS buffer 163c at two stages before the final stage, resulting in the delay of turning on the rectification MOSFET 101. Generally, the channel length L_h3 is determined in the process of manufacturing a chip, and thus it is preferable to reduce the channel width W_h3.

In other words, when notating the channel width and the channel length of the high-side P-type MOSFET 154c and the low-side N-type MOSFET 155c of the CMOS buffer 163c at two stage before the final stage respectively as W_h3, L_h3, W_l3, and L_l3, the design of the channel width W_h3 and w_i3 needs to be conducted to satisfy the following equation (3):

[Math. 3]

$$\frac{W\_h3}{L\_h3} < \frac{2 \times W\_l3}{L\_l3} \tag{3}$$

Figure 15:
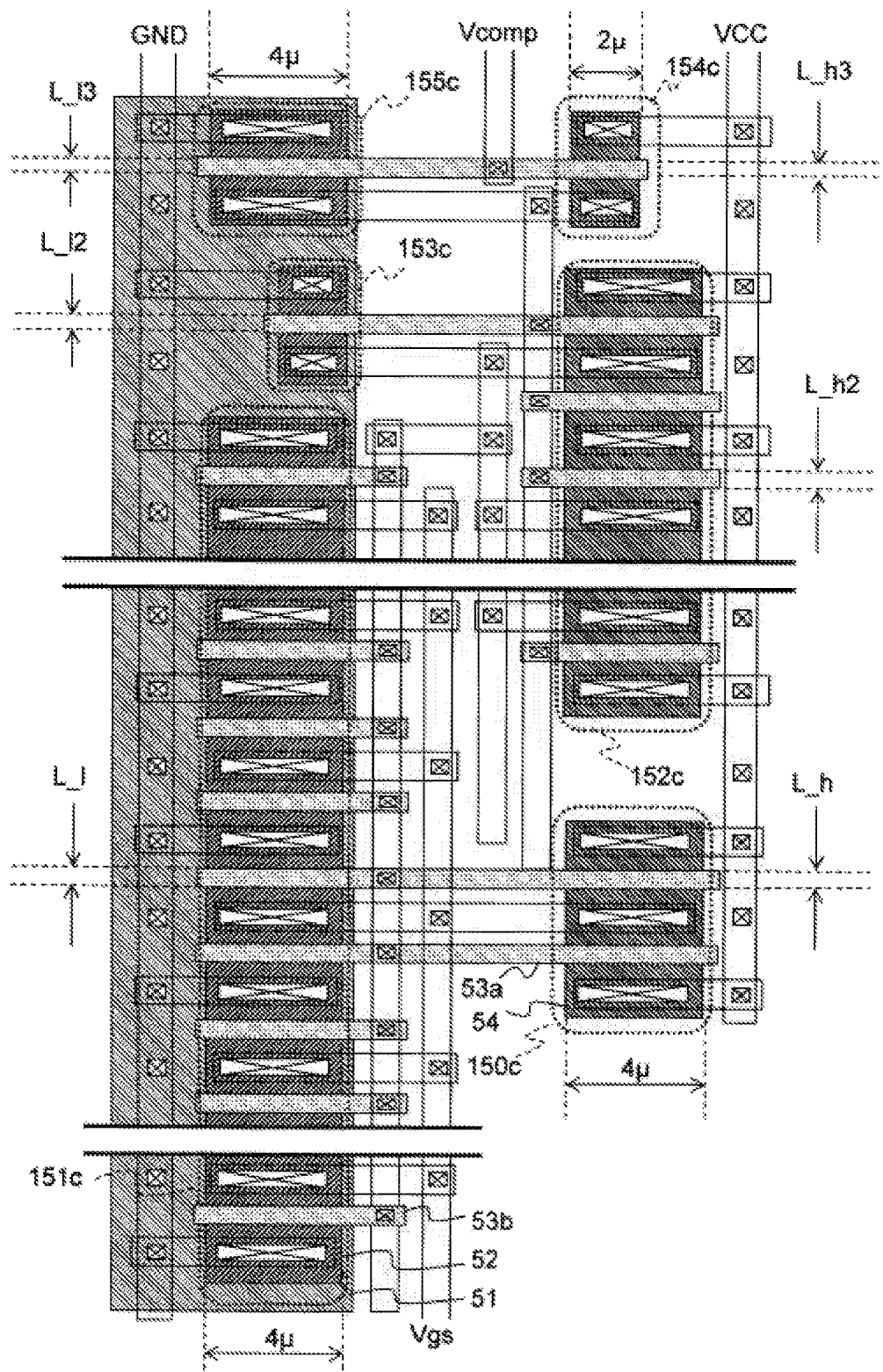
FIG. 15 is a layout diagram showing a channel length and a channel width of a gate drive circuit of the modification of the fourth embodiment.

The rectifier 132c shown in FIG. 14 that is a modification example of the fourth embodiment provides the same effect as the rectifier 132 of the fourth embodiment shown in FIG. 12, and an additional effect described in FIG. 15.

FIG. 15 is a layout diagram showing the channel length and the channel width of the gate drive circuit 105c according to a modification of the fourth embodiment.

When constituting the gate drive circuit 105c with a plurality of CMOS buffers 161c to 163c (see FIG. 14), in the high-side P-type MOSFET and the low-side N-type MOSFET constituting the single CMOS buffer, it is preferable that the current of the MOSFET driving the rectification MOSFET 101 to turn on the rectification MOSFET 101 is smaller than the current of the MOSFET driving the rectification MOSFET 101 to turn off the rectification MOSFET 101.

The high-side P-type MOSFET 150c has a channel formed by a polysilicon wiring 53a which is formed on the high-concentration P-type silicon region 54. The channel length L_h of the high-side P-type MOSFET 150c is the same length as the other channel length, the channel width is 8 um in total, since two channels of 4 μm width is formed.

The low-side N-type MOSFET 151c has a channel formed by a polysilicon wiring 53b formed on the high-concentration N-type silicon region 52. The high-concentration N-type silicon region 52 is surrounded by a P-type well silicon region 51. The channel length L_l of the low-side N-type MOSFET 151c is the same as those of other low-side N-type MOSFETs, and its channel width is 64 μm in total since 16 channels of 4 μm width are formed.

In other words, the channel width W_h of the high-side P-type MOSFET 150c of the final stage is 8 μm, and the channel width W_l of the low-side N-type MOSFET 151c is 64 μm.

Channel width W_h2 of the high-side P-type MOSFET 152c of one stage before the final stage is 32 μm, which includes eight channels with 4 μm width. FIG. 15 shows the four channels and others are omitted. Channel width W_l2 of the low-side N-type MOSFET 153c is 2 μm.

The channel width W_h3 of the high-side P-type MOSFET 154c at two-stage before the final stage is 2 μm, and the channel width W_l3 of the low-side N-type MOSFET 155c is 4 μm.

The gate capacitance of the CMOS buffer 162c at one stage before the final stage and the CMOS buffer 163c at the second stage before the final stage can be reduced by reducing the channel width W_l2 of the low-side N-type MOSFET 153c one stage before the final stage, and further reduced by reducing the channel width W_h3 of the high-side P-type MOSFET 154c two stages before the final stage.

In the gate drive circuit 105c shown in FIG. 15 that is the modification of the fourth embodiment, the delay of the gate drive circuit 105c at the time when the rectification MOSFET 101 is turned off can be further shortened by reducing the channel width W_l2 of the low-side N-type MOSFET 153c at one-stage before the final stage and the channel width W_h3 of the high-side P-type MOSFET 154c at two-stages before the final stage than otherwise. This allows for reducing the dependency on the temperature and frequency at the timing of turning off the rectification MOSFET 101. In addition, the circuit area can be smaller according to the decrease of each channel width.

The channel width of the high-side P-type MOSFET 150 the final stage of modification of the first embodiment is 128 um. In contrast, the channel width of the high-side P-type MOSFET 150 at the final stage of the fourth embodiment is 8 um, and is significantly reduced. The channel width of the low-side N-type MOSFET 153 at one stage before the final stage of the modification of the first embodiment is 16 um. In contrast, the channel width of the low-side N-type MOSFET 153 at one stage before the final stage of the fourth embodiment is 2 um, and is significantly reduced. The channel width of the high-side P-type MOSFET 154 at two-stages before the final stage of the modification of the first embodiment is 8 um. In contrast, the channel width of the high-side P-type MOSFET 154c at one-stage before the final stage of the fourth embodiment is 2 um, and is significantly reduced.

Furthermore, in the gate drive circuit 105c of the fourth embodiment, the MOSFET whose channel width is small, and the MOSFET whose channel width is large are alternately laid vertically (PMOS and NMOS). Accordingly, further reducing the circuit area by stuffing can reduce in the mounting area and cost.

Additionally, the filter effect of slowing the output response enables suppressing the vibration of the CMOS buffer 162 at one stage before the final stage and the CMOS buffer 163 at two stages before the final stage.

FIG. 14 and FIG. 15 illustrate configurations of three stages of CMOS buffers constituting a part of the gate drive circuit 105c in which the high-side P-type MOSFET and the low-side N-type MOSFET constituting the single CMOS buffer may be preferably configured such that the current of the MOSFET driving the rectification MOSFET 101 to turn on the rectification MOSFET 101 is smaller than the current of the MOSFET driving the rectification MOSFET 101 to turn off the rectification MOSFET 101. However, the number of stages of the CMOS buffer constituting a part of the gate drive circuit is not limited to three, and a configuration having another number of stages of the CMOS buffer may provide the same effect.

The gate drive circuit 105c shown in FIGS. 14 and 15 including a plurality of stages of CMOS buffer 161c to 163c may be applied to the first to third embodiments and provide the same effect.

As described above, the autonomous type synchronous rectification MOSFET of the present invention provides the effect of preventing the chattering and the additional effect of preventing the through-current through the high-side and low-side rectifier occurring when the noise is applied, without increasing the capacitance of the capacitor 107 and without using any complicated circuit.

Although the above description shows the case of using the rectifier 132 of the first to fourth embodiments for the rectification circuit 130 of the alternator 140, it may also be used for the rectification circuit 130 of the apparatus other than the alternator 140.

Figure 16:
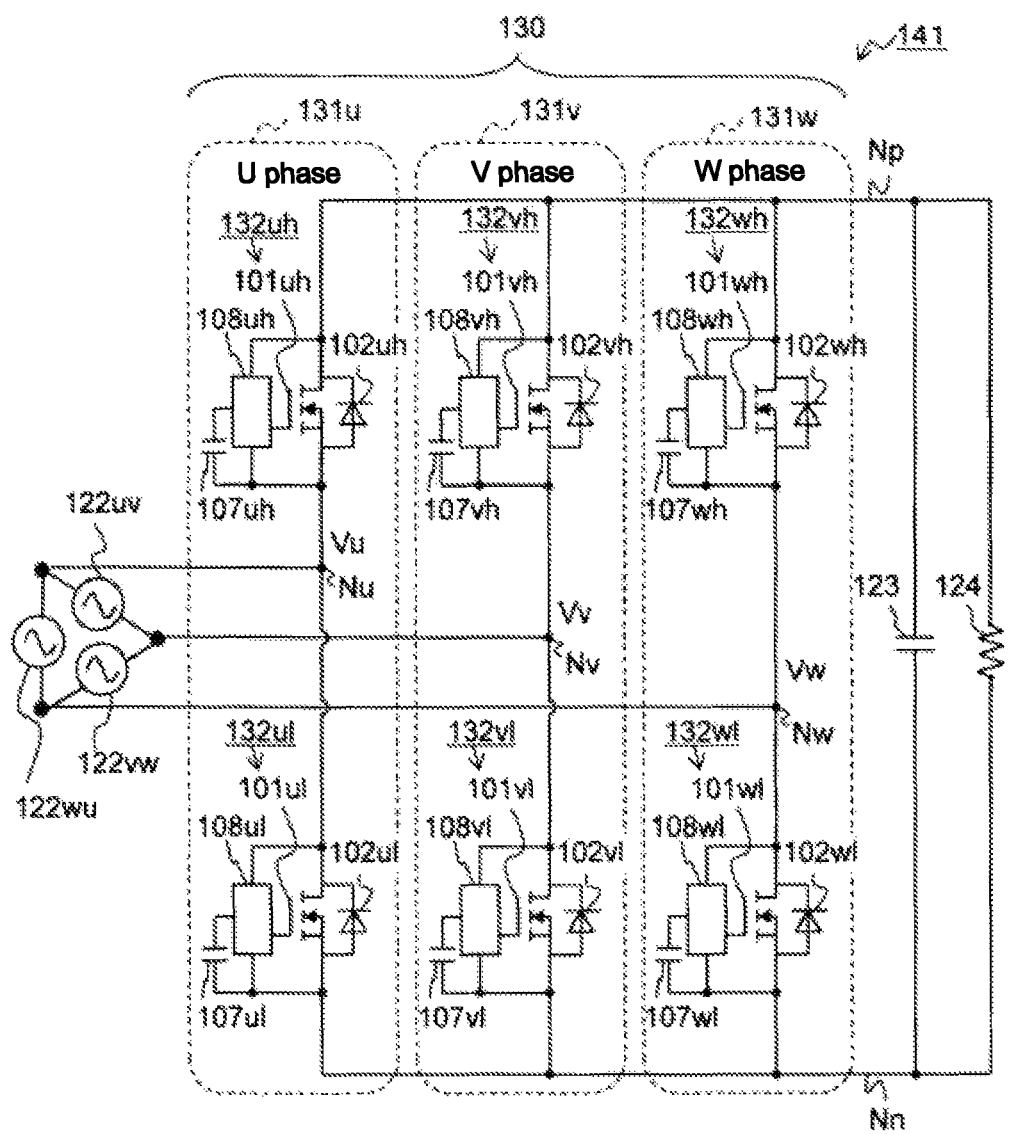
FIG. 16 is a circuit diagram showing a schematic configuration of a power converter using an autonomous rectifier.

FIG. 16 is a circuit diagram showing the schematic configuration of the power converter 141 using the autonomous type of rectifier 132 according to the fifth embodiment. The same reference signs are assigned to the same elements as those of the alternator 140 of the first embodiment shown in FIG. 1.

The power converter 141 includes an AC power supplies 122uv, 122vw, and 122wu; a rectification circuit 130; a smoothing capacitor 123; and a DC load 124.

The AC power supplies 122uv, 122vw, and 122wu are power sources for supplying a three-phase alternating current. The AC power supplies 122uv, 122vw, and 122wu are Δ-connected. The AC power supplies 122wu and 122uv are connected to the node Nu of the rectification circuit 130. The AC power supplies 122uv and 122vw are connected to the node Nv of the rectification circuit 130. The AC power supplies 122vw and 122wu are connected to the node Nw of the rectification circuit 130.

The rectification circuit 130 is a bridge circuit to rectify the three-phase alternating current to a direct current and configured in a similar way to the rectifying circuit 130 of the alternator 140 shown in FIG. 1. The rectification circuit 130 has a smoothing capacitor 123 (energy storage unit) and the DC load 124 connected in parallel between DC terminals, i.e., the nodes Np and Nn and supplies DC power.

The smoothing capacitor 123 is a capacitor for smoothing the DC voltage. The DC load 124 is any load that receives the DC power to be driven, for example, a motor, lighting, and the like.

The power converter 141 may use the rectifiers 132, and 132a to 132c of the respective embodiments, and the voltage and current waveforms showing the behavior of each rectification circuit are the same as FIGS. 4A to 4E and 5A to 5E. This provides an effect of preventing the chattering and the through-current when a noise is applied.

It should be appreciated that the present invention is not limited to the embodiments described above and may include various modifications. For example, the embodiments described above are detailed for easy understanding but the present invention is not necessarily limited to include all the above configurations. Further, some structures of an embodiments can be replaced by structures of another embodiment, and a structure of an embodiment can be added to a structure of another embodiment. Furthermore, some of the structures of each embodiment can be partly deleted, added, or replaced with other structures.

In the respective embodiments, the control line and information line show what is believed to need an explanation, not necessarily indicate all control lines or information lines for products. In fact, almost all of the components may be considered to be connected to each other.

REFERENCE SIGNS LIST

101: rectification MOSFET
102: built-in diode
103: determination circuit
105: gate drive circuit
106: diode
107: capacitor
108: control IC
109: rotor coil
110uv, 110vw, 110wu: stator coil
111: battery
122uv, 122vw, 122wu: AC power supply
123: smoothing capacitor
124: DC load
130: rectification circuit
132: rectifier
140: alternator
141: electric power converter
150, 150c, 152c, 154c: high-side P-type MOSFET
151, 151c, 153c, 155c: low-side N-type MOSFET
156: constant-current circuit
157: diode
161: CMOS buffer (first CMOS buffer)
162: CMOS buffer (second CMOS buffer)
163: CMOS buffer (third CMOS buffer)
164: CMOS inverter
Idl, Idh: drain current
Vcomp: comparison signal
Id: drain current (rectified current)
Ig: gate current
IN+: non-inverted input terminal
IN−: inverted input terminal
Vds: drain-source voltage
Vgs, Vgsh, Vgsl: gate voltage
Nu, Nv, Nw: node (AC terminals)
Np, Nn: node (DC terminal)
Th: positive main terminal (one of a pair of main terminals)
Tl: negative main terminal (the other of the pair of main terminals)
CC1~CC7: constant-current circuit
Tr1~Tr3: N-type bipolar transistor
D1~D3: diode
31: N-type MOSFET
OUT: output terminal
GND: ground terminal
VCC: power supply voltage terminal
Vcomp: comparison signal

We claim:

1. A rectifier comprising:
a rectification MOSFET configured to perform synchronous rectification;
a determination circuit configured to:
input a voltage between a pair of main terminals of the rectification MOSFET; and
determine on and off states of the rectification MOSFET on a basis of the voltage between the pair of main terminals,
a gate drive circuit configured to:
perform turn on and turn off of a gate of the rectification MOSFET according to a determination result from the determination circuit; and
make a time required for boosting a gate voltage when turning on the rectification MOSFET longer than a time required for lowering the gate voltage when turning off the rectification MOSFET;
wherein the gate drive circuit is configured to include:
a first CMOS buffer including a high-side MOSFET and a low-side MOSFET, wherein an output of the first CMOS buffer is connected to the gate of the rectification MOSFET, and wherein
a current flowing through the high-side MOSFET of the first CMOS buffer when turning on the rectification MOSFET is smaller than a current flowing through the low-side MOSFET of the first CMOS buffer when turning off the rectification MOSFET;
wherein the gate drive circuit includes a second CMOS buffer having an output connected to an input of the first CMOS buffer; and
wherein a current flowing through a low-side MOSFET of the second CMOS buffer when turning on the rectification MOSFET is smaller than a current flowing through a high-side MOSFET of the second CMOS buffer when turning off the rectification MOSFET.

2. The rectifier according to claim 1, wherein
the first CMOS buffer is configured so that a quotient obtained by dividing a gate width of the high-side MOSFET by a gate length of the high-side MOSFET is less than a double of a quotient obtained by dividing a gate width of the low-side MOSFET by a gate length of the low-side MOSFET.

3. The rectifier according to claim 1, wherein
the first CMOS buffer is configured to have a resistor connected in series to the high-side MOSFET and placed in a path of a current for turning on the gate of the rectification MOSFET.

4. The rectifier according to claim 1, wherein
a constant-current circuit is connected in series with the high-side MOSFET of the first CMOS buffer, and placed in a path of a current for turning on the gate of the rectification MOSFET.

5. The rectifier according to claim 1, wherein
a resistor and a diode are connected in parallel between the output of the first CMOS buffer and the gate of the rectification MOSFET,
the diode is connected in a direction in which a current flows from the gate of the rectification MOSFET to the output of the first CMOS buffer.

6. The rectifier according to claim 1, wherein
the second CMOS buffer is configured so that a quotient obtained by dividing a gate width of the high-side MOSFET by a gate length of the high-side MOSFET is greater than a double of a quotient obtained by dividing a gate width of the low-side MOSFET by a gate length of the low-side MOSFET.

7. The rectifier according to claim 1, wherein
the gate drive circuit includes a third CMOS buffer having an output connected to an input of the second CMOS buffer, wherein a current flowing through a high-side MOSFET of the third CMOS buffer when turning on the rectification MOSFET is smaller than a current flowing through a low-side MOSFET of the third CMOS buffer when turning off the rectification MOSFET.

8. The rectifier according to claim 7, wherein
the third CMOS buffer is configured so that a quotient obtained by dividing a gate width of the high-side MOSFET by a gate length of the high-side MOSFET is smaller than a double of a quotient obtained by dividing a gate width of the low-side MOSFET by a gate length of the low-side MOSFET.

9. The rectifier according to claim 1, wherein
the determination circuit is a comparator including a MOSFET.

10. The rectifier according to claim 1, wherein
a current flowing through the determination circuit is regulated by a constant-current circuit.

11. The rectifier according to claim 1, wherein
the determination circuit includes a bipolar transistor and a diode,
if the rectification MOSFET is in a first state of either one of on and off, the bipolar transistor is in an off state and a forward current flows through the diode;
if the rectification MOSFET is in a second state of either one of on or off, the second state being different from the first state, the bipolar transistor is in an on state and no forward current flows through the diode.

12. The rectifier according to claim 1, wherein
the time required for lowering the gate voltage when turning off the rectification MOSFET is a time from when the gate voltage becomes 90% of a maximum gate voltage until when the gate voltage reaches a threshold voltage of the rectification MOSFET;
the time required for boosting the gate voltage when turning on the rectification MOSFET is a time from when the gate voltage becomes 10% of the maximum gate voltage until when the gate voltage reaches the threshold voltage of the rectification MOSFET.

13. An alternator comprising:
a rectification circuit of bridge-type, in which a DC terminal is connected to a battery and an AC terminal is connected to an AC power source;
the rectifiers according to claim 1 that are connected respectively to a high-side and a low-side of the rectification circuit.

14. A power converter comprising:
a rectification circuit of bridge-type, in which a DC terminal is connected to an energy storing unit and an AC terminal is connected to an AC power source;
the rectifiers according to claim 1 that are connected respectively to a high-side and a low-side of the rectification circuit.

* * * * *